US012106969B2

(12) United States Patent
Xie et al.

(10) Patent No.: US 12,106,969 B2
(45) Date of Patent: Oct. 1, 2024

(54) SUBSTRATE THINNING FOR A BACKSIDE POWER DISTRIBUTION NETWORK

(71) Applicant: International Business Machines Corporation, Armonk, NY (US)

(72) Inventors: Ruilong Xie, Niskayuna, NY (US); Balasubramanian Pranatharthiharan, Watervliet, NY (US); Mukta Ghate Farooq, Hopewell Junction, NY (US); Julien Frougier, Albany, NY (US); Takeshi Nogami, Schenectady, NY (US); Roy R. Yu, Poughkeepsie, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 556 days.

(21) Appl. No.: 17/205,037

(22) Filed: Mar. 18, 2021

(65) Prior Publication Data

US 2022/0301878 A1 Sep. 22, 2022

(51) Int. Cl.
*H01L 21/306* (2006.01)
*H01L 21/762* (2006.01)
*H01L 21/768* (2006.01)
*H01L 23/528* (2006.01)

(52) U.S. Cl.
CPC .. *H01L 21/30625* (2013.01); *H01L 21/76224* (2013.01); *H01L 21/76816* (2013.01); *H01L 23/5286* (2013.01)

(58) Field of Classification Search
CPC ......... H01L 21/30625; H01L 21/76224; H01L 21/76816; H01L 23/5286
See application file for complete search history.

(56) References Cited

U.S. PATENT DOCUMENTS

| 8,138,036 B2 * | 3/2012 | Andry | H01L 23/481 257/E21.585 |
|---|---|---|---|
| 10,325,804 B2 | 6/2019 | Hellmund et al. | |
| 10,636,739 B2 | 4/2020 | Beyne et al. | |
| 2012/0168935 A1 * | 7/2012 | Huang | H01L 21/6835 438/455 |

(Continued)

FOREIGN PATENT DOCUMENTS

WO WO-2011119192 A1 * 9/2011 ............. H01L 21/00

OTHER PUBLICATIONS

Ryckaert et al., "Extending the roadmap beyond 3nm through system scaling boosters: A case study on Buried Power Rail and Backside Power Delivery," Electron Devices Technology and Manufacturing Conference (EDTM), 2019, pp. 50-52.

*Primary Examiner* — Dale E Page
*Assistant Examiner* — Quovaunda Jefferson
(74) *Attorney, Agent, or Firm* — Jeffrey Ingalls

(57) ABSTRACT

A method of manufacturing a semiconductor device is provided. The method includes forming a first recess partially through a substrate from a first side of the substrate, forming a dielectric layer in the first recess, forming a second recess partially through the dielectric layer from the first side of the substrate, and forming a buried power rail (BPR) in the second recess of the dielectric layer. The method also includes thinning the substrate from a second side of the substrate to a level of the dielectric layer, the second side of the substrate being opposite to the first side of the substrate.

17 Claims, 23 Drawing Sheets

(56) References Cited

U.S. PATENT DOCUMENTS

| | | | |
|---|---|---|---|
| 2012/0276736 A1* | 11/2012 | Idani | H01L 21/76816 |
| | | | 438/642 |
| 2020/0105671 A1 | 4/2020 | Lai et al. | |
| 2020/0152508 A1 | 5/2020 | Jourdain et al. | |
| 2020/0266169 A1 | 8/2020 | Kang et al. | |

* cited by examiner

SUBSTRATE THINNING FOR A BACKSIDE POWER DISTRIBUTION NETWORK

BACKGROUND

The present disclosure relates to fabrication methods and resulting structures for semiconductor devices. More specifically, the present disclosure relates to fabrication methods and resulting structures for enabling precise substrate thinning for backside power distribution network structures of semiconductor devices.

In certain semiconductor device fabrication processes, substrate thinning may be an important processing step for certain devices with backside power distribution network. It may be desirable to improve the process of wafer thinning for backside power distribution networks.

SUMMARY

Embodiments of the present disclosure relate to a method of manufacturing a semiconductor device is provided. The method includes forming a first recess partially through a substrate from a first side of the substrate, forming a dielectric layer in the first recess, forming a second recess partially through the dielectric layer from the first side of the substrate, and forming a buried power rail (BPR) in the second recess of the dielectric layer. The method also includes thinning the substrate from a second side of the substrate to a level of the dielectric layer, the second side of the substrate being opposite to the first side of the substrate.

Embodiments of the present disclosure relate to a method of manufacturing a semiconductor device. The method includes forming a first recess partially through a substrate from a first side of the substrate, forming a dielectric layer in the first recess, and thinning the substrate from a second side of the substrate to a level of the dielectric layer, the second side of the substrate being opposite to the first side of the substrate.

Embodiments of the present disclosure relate to a semiconductor device. The semiconductor device includes a front-end-of-line (FEOL) substrate, a buried power rail (BPR) formed on the FEOL substrate, an interlayer dielectric layer (ILD) layer formed on the BRP and the FEOL substrate, a backside power distribution network electrically connected to the BPR, and a dielectric pillar extending from the FEOL substrate into the ILD layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
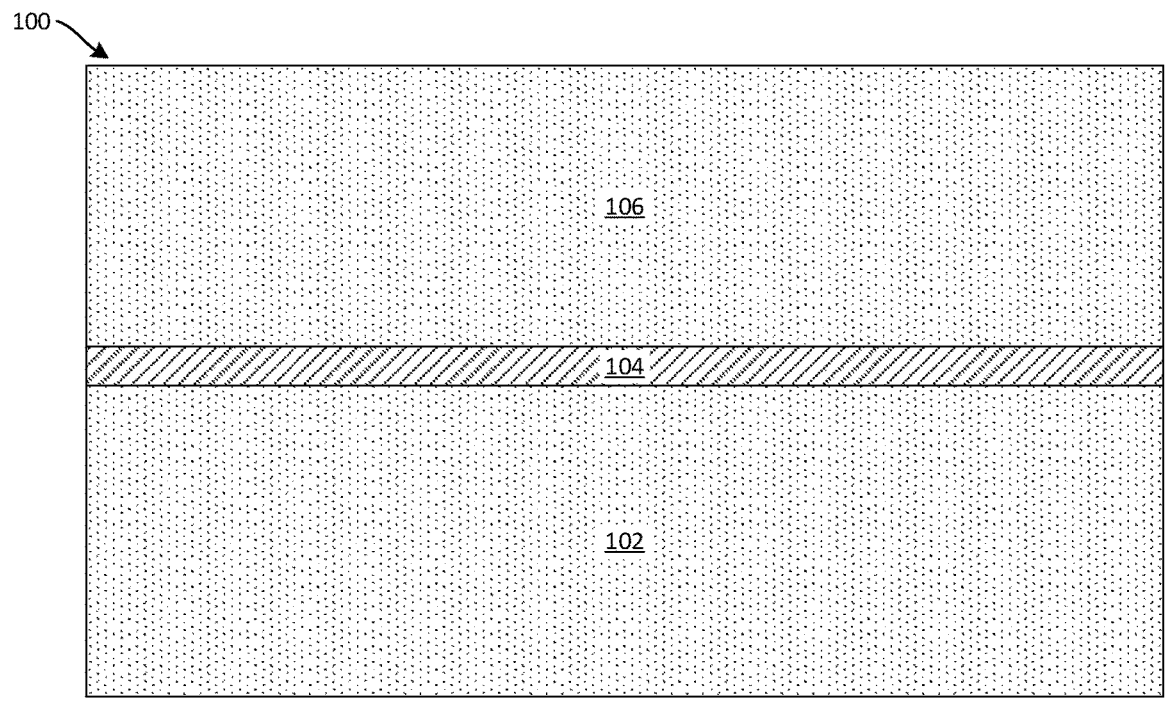
FIG. 1 is a cross-sectional view of a semiconductor device at an intermediate stage of the manufacturing process, according to embodiments.

The present disclosure describes semiconductor devices and methods of manufacturing the semiconductor devices. In particular, the present disclosure describes fabrication methods and resulting structures for enabling precise substrate thinning for semiconductor devices that include backside power distribution network structures.

Certain approaches to substrate thinning may involve high risk and high cost in the manufacturing process. In one example, a semiconductor device may be formed on a silicon-on-insulator (SOI) wafer, where a Si channel layer is over the buried oxide layer which is above substrate. In this example, various front-end-of-line (FEOL) layers, middle-of-line (MOL) layers, signal routing layers and buried power rail (BPR) structures may be formed over the Si channel layer on the front side of the device. After the formation of these layers, the wafer may be flipped upside down to perform thinning (e.g., backside grinding and etching) on the underlying semiconductor substrate. When thinning the silicon substrate, it may be desirable to stop the thinning process on the buried oxide layer. However, starting with the SOI wafer increases the process fabrication cost. Some other approach could replace the buried oxide with a sacrificial SiGe epi layer. When thinning the silicon substrate, it may be desirable to stop the thinning process on the SiGe. However, this process may be difficult to control unless the SiGe is very thick (e.g. >200 nm), which would also increase the cost, and also generate epi related defects too. Also, because of difficulties with controlling this thinning operation, it may be possible that not enough material of the Si substrate is removed. In certain cases, the thickness of the Si substrate may not be sufficiently uniform. Therefore, it may be difficult to ascertain when the thinning process should be stopped to adequately remove enough material but without removing too much material.

The flowcharts and cross-sectional diagrams in the Figures illustrate methods of manufacturing fin field-effect transistor (FINFET) devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers. Please note that in this disclosure we use FINFET as illustration, and the disclosed method and structure applies to any kind of device types, such as planar transistor, nanosheet, nanowire, stacked FETs, III-V or 2D channel FETs, etc.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Referring now to the drawings in which like numerals represent the same or similar elements and initially to FIG. 1, this figure depicts a cross-sectional view of a semiconductor device 100, according to embodiments. As shown in FIG. 1, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) that those listed above. As will be described in further detail below, the substrate 102 will be ultimately subjected to a thinning process, where the substrate 102 is gradually removed by one or more of a grinding process and a chemical etching process. As shown in FIG. 1, a SiGe layer 104 is formed by epitaxy growth on the upper surface of the substrate 102. A second epitaxy layer 106 (e.g., additional Si material) is formed on the SiGe layer 104. The thickness of the layer 104 ranges from 5 to 40 nm, the thickness of layer 106 ranges from 10 to 100 nm.

Figure 2:
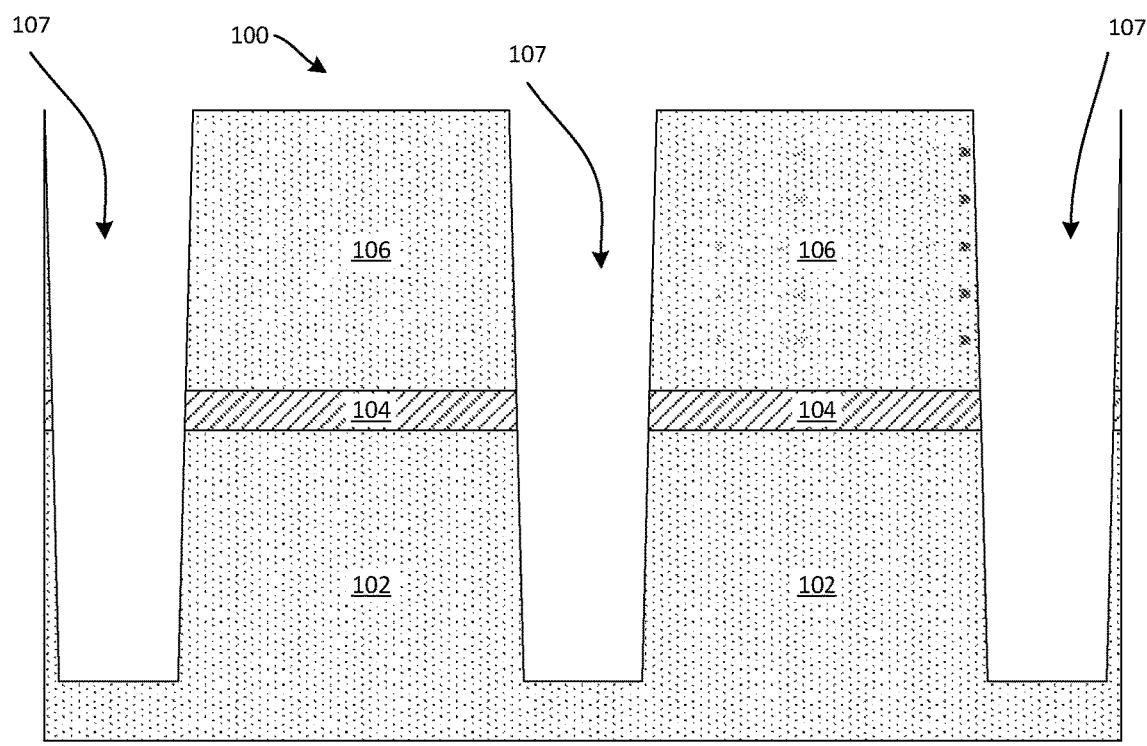
FIG. 2 is a cross-sectional view of the semiconductor device of FIG. 1 after additional fabrication operations, according to embodiments.

Referring now to FIG. 2, this figure depicts a cross-sectional view of the semiconductor device 100 of FIG. 1 after additional fabrication operations, according to embodiments. As shown in FIG. 2, trenches 107 (or vias) are patterned into the substrate 102 through the second substrate 106 and the SiGe layer 104. This patterning may be performed with any suitable etching technique such as RIE or plasma etching. As shown in FIG. 2, in certain examples, there may be a slight taper angle associated with the trenches 107. The trenches extend beyond the depth of layer 104 into the substrate 102, by 30 to 500 nm.

Figure 3:
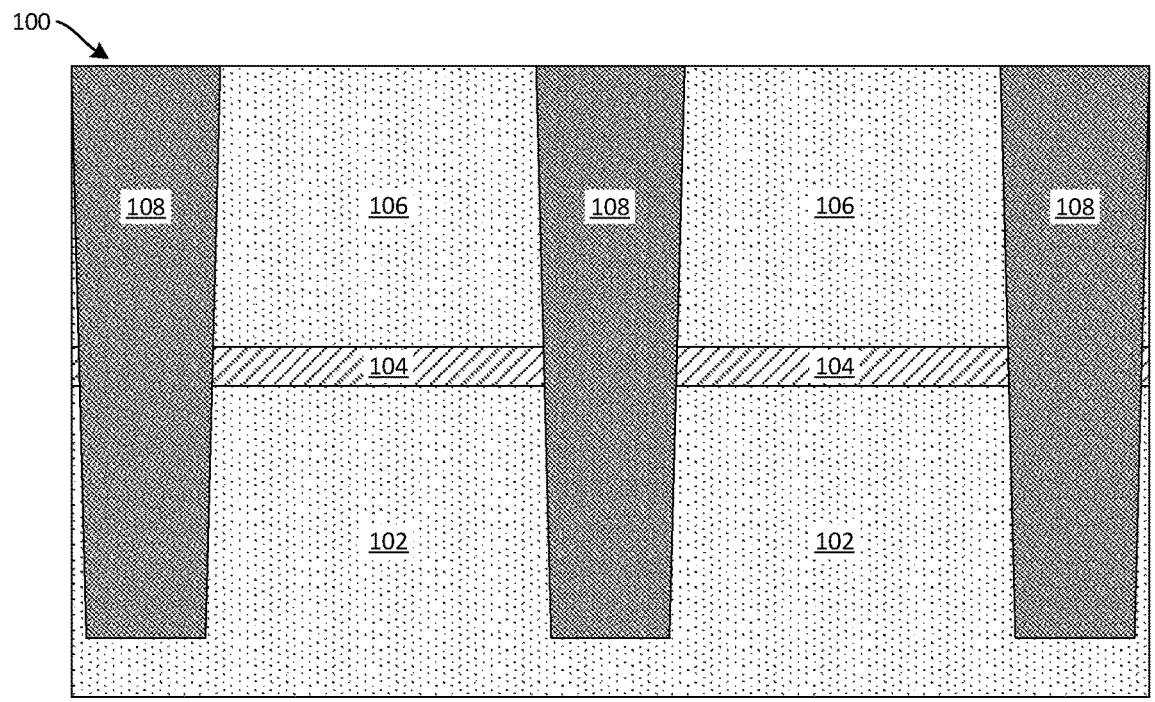
FIG. 3 is a cross-sectional view of the semiconductor device FIG. 2 after additional fabrication operations, according to embodiments.

Referring now to FIG. 3, this figure depicts a cross-sectional view of the semiconductor device 100 of FIG. 2 after additional fabrication operations, according to embodiments. As shown in FIG. 3, after the formation of the trenches 107, they are filled in with a dielectric material to form a first dielectric layer 108. In certain examples, the first dielectric layer 108 may be formed in excess above the upper surface of the second substrate 106. Then, the semiconductor device 100 may be planarized with a suitable material removal process such as CMP.

Figure 4:
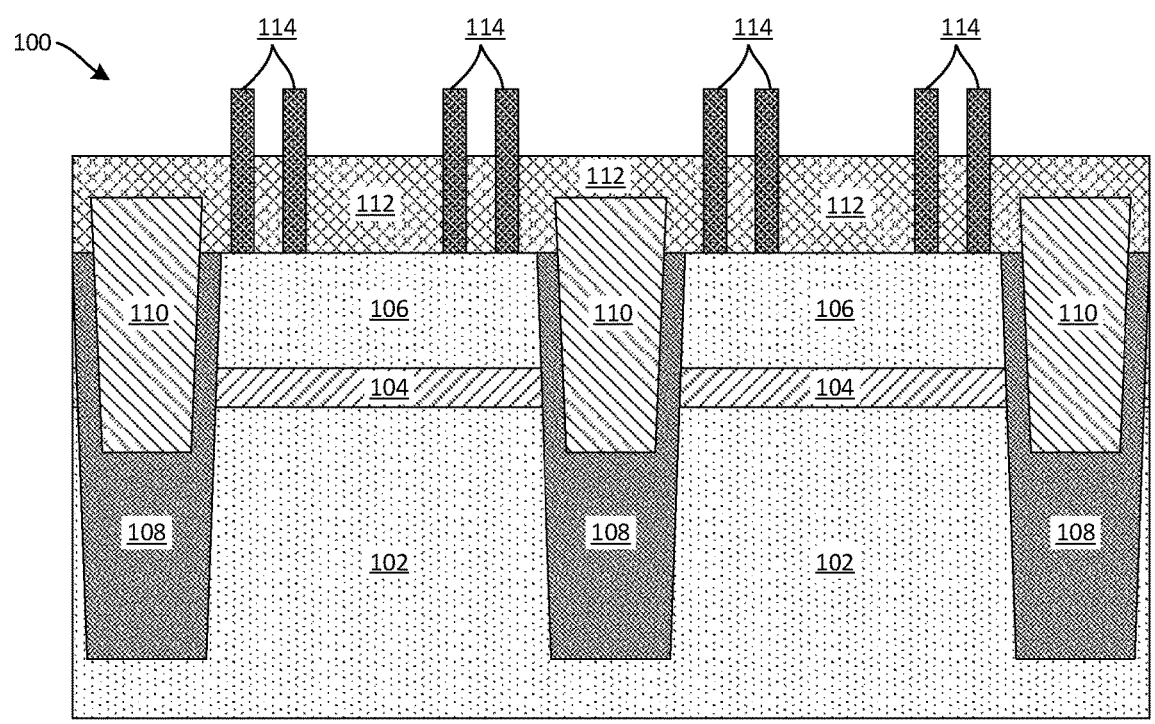
FIG. 4 is a cross-sectional view of the semiconductor device of FIG. 3 after additional fabrication operations, according to embodiments.

Referring now to FIG. 4, this figure depicts a cross-sectional view of the semiconductor device 100 of FIG. 3 after additional fabrication operations, according to embodiments. As shown in FIG. 4, after the formation of the first dielectric layer 108, additional fabrication operations are performed to define FEOL active regions, shallow trench isolation (STI) regions, and to form a buried power rail (BPR) layer 110. In general, a standard cell (i.e., a base unit for designing and manufacturing an integrated circuit) of a device requires a power input and a ground connection. To power the various components thereof, each standard cell is generally coupled to a power rail which is electrically connected to an active layer of the standard cell to provide the power. In some instances, a plurality of power rails may be provided for each standard cell to respectively provide the power and the ground. Regarding a "buried" power rail (or buried rail), the rail can be encased either within the shallow-trench isolation (STI) layer 112 or within the bulk silicon substrate 102 (and/or the second substrate 106) and the STI layer 112 together. In general, a BPR refers to a power rail that is buried below a back-end-of-line (BEOL) metal stack, usually in-level (or near in level) with the transistor fins 114 themselves. A "back-side" generally refers to a level that is below a transistor substrate. The back-side power delivery may help alleviate certain design challenges and enable technology scaling beyond the 5 nm technology node. Also, BPR technology may free up resources for dense logic connections that limit modern processor performance, enable further scaling of a standard logic cell by removing the overhead in the area occupied by the power rails.

Referring again to FIG. 4, in certain embodiments, the first dielectric layer 108 is formed to a sufficient depth below the bottom surface of the SiGe layer 104 so that when the wafer is later flipped upside down to perform wafer thinning, the first dielectric layer 108 functions as a hard stop to prevent excess material from being removed (e.g., removing or damaging portion of the SiGe layer 104). As shown in FIG. 4, the BPR layer 110 is formed in portions of the first dielectric layer 108. It should be appreciated that a combination of material removal processes (e.g., etching) and material addition processes (e.g., patterning and deposition) that are known one of skill in the art (and as described herein) may be used to generate the structures shown in FIG. 4. Although the BPR layer 110 is shown to be formed in each portion of the first dielectric layer 108, in other examples it is not necessary for the BPR layer 110 to be formed in the first dielectric layer 108. Moreover, it should be appreciated that in instances where the BPR layer 110 is formed in the first dielectric layer 108 (i.e., as shown in FIG. 4), not every portion of the first dielectric layer 108 needs to include a BPR layer 110. STI regions may be formed in various locations throughout the STI layer 112. In general, STI (also known as a box isolation technique) is an integrated circuit feature which prevents electric current leakage between adjacent semiconductor device components. STI is generally used on CMOS process technology nodes of 250 nanometers and smaller.

It should be appreciated that the positions and locations of the various components (e.g., STI layer 112, transistor fins 114) may be varied in any suitable manner according to the specific application. However, in the embodiments described with respect to FIG. 4, the first dielectric layer 108 should be formed to a depth that is below the lower surface (as shown in FIG. 4) of the SiGe layer 104. In this regard, when the wafer is later flipped over for substrate 102 thinning, the first dielectric layer 108 may function as a hard stop to the thinning process to prevent (or minimize) any damage to the SiGe layer 104.

Figure 5:
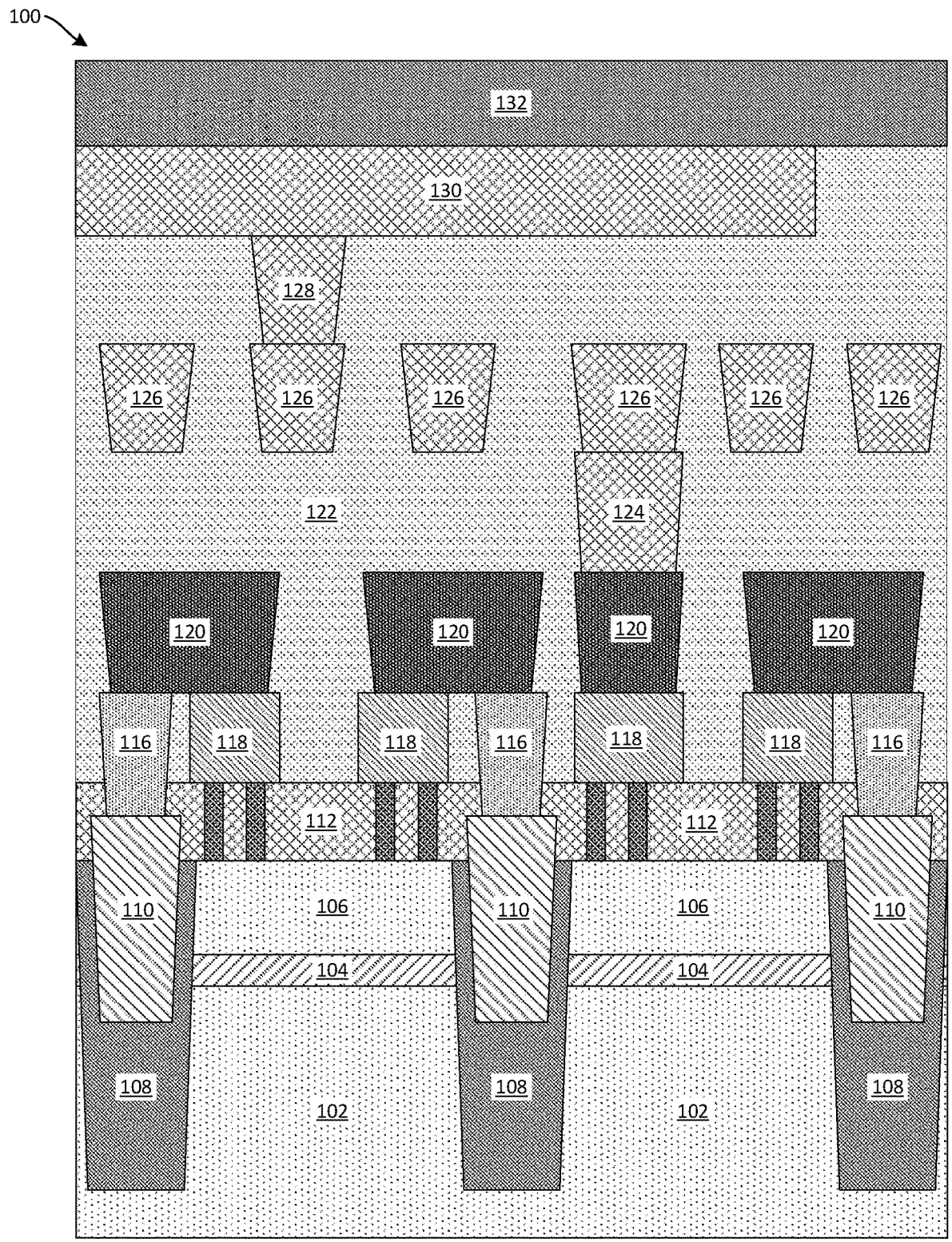
FIG. 5 is a cross-sectional view of the semiconductor device of FIG. 4 after additional fabrication operations, according to embodiments.

Referring now to FIG. 5, this figure depicts a cross-sectional view of the semiconductor device 100 of FIG. 4 after additional fabrication operations, according to embodiments. As shown in FIG. 5, several additional components are formed, which may include front-end-of-line (FEOL) components, middle-of-line (MOL) components, and back-end-of-line (BEOL) components. In the example shown in FIG. 5, source/drain epitaxial regions 118 are formed on top of the transistor fins 114. Several contact vias 116 electrically connect the BPR layer 110 to the source/drain epitaxial regions 118 through a contact 120. One or more dielectric layer 122, second vias 124, metal lines 126, third vias 128, and second metal lines 130 may be formed. BEOL layer 132 generically represents any suitable number or configuration of BEOL layers/components. It should be appreciated that the configuration of the FEOL, MOL and BEOL layers (and components thereof) depicted in FIG. 4 is merely one example that is used for the sake of providing context to the locations of the first dielectric layer 108 and the BPR layer 110 relative to the other components, and any suitable number/position/configuration of the these layers may be used. In other words, the different metal layers, contacts, vias etc., are merely provided to show a nonlimiting example of where the first dielectric layer 108, the BPR layer 110, and the SiGe layer 104 may be positioned relative to same.

Figure 6:
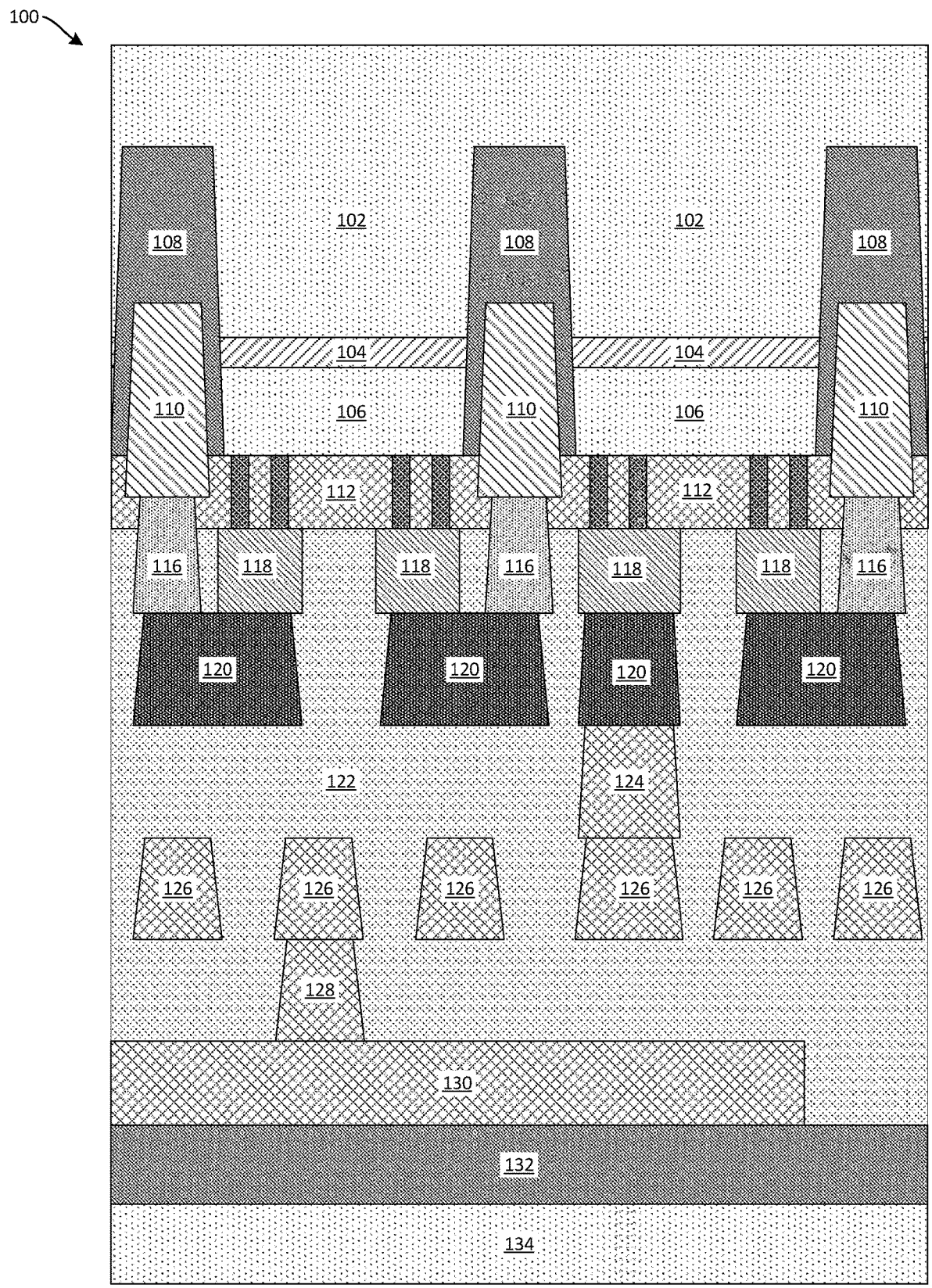
FIG. 6 is a cross-sectional view of the semiconductor device of FIG. 5 after additional fabrication operations, according to embodiments.

Referring now to FIG. 6, this figure depicts a cross-sectional view of the semiconductor device 100 of FIG. 5 after additional fabrication operations, according to embodiments. As shown in FIG. 6, the semiconductor device 100 is flipped upside down to prepare the device for substrate 102 thinning. In certain embodiments, a carrier wafer 134 is also bonded to the BEOL layers 132.

Figure 7:
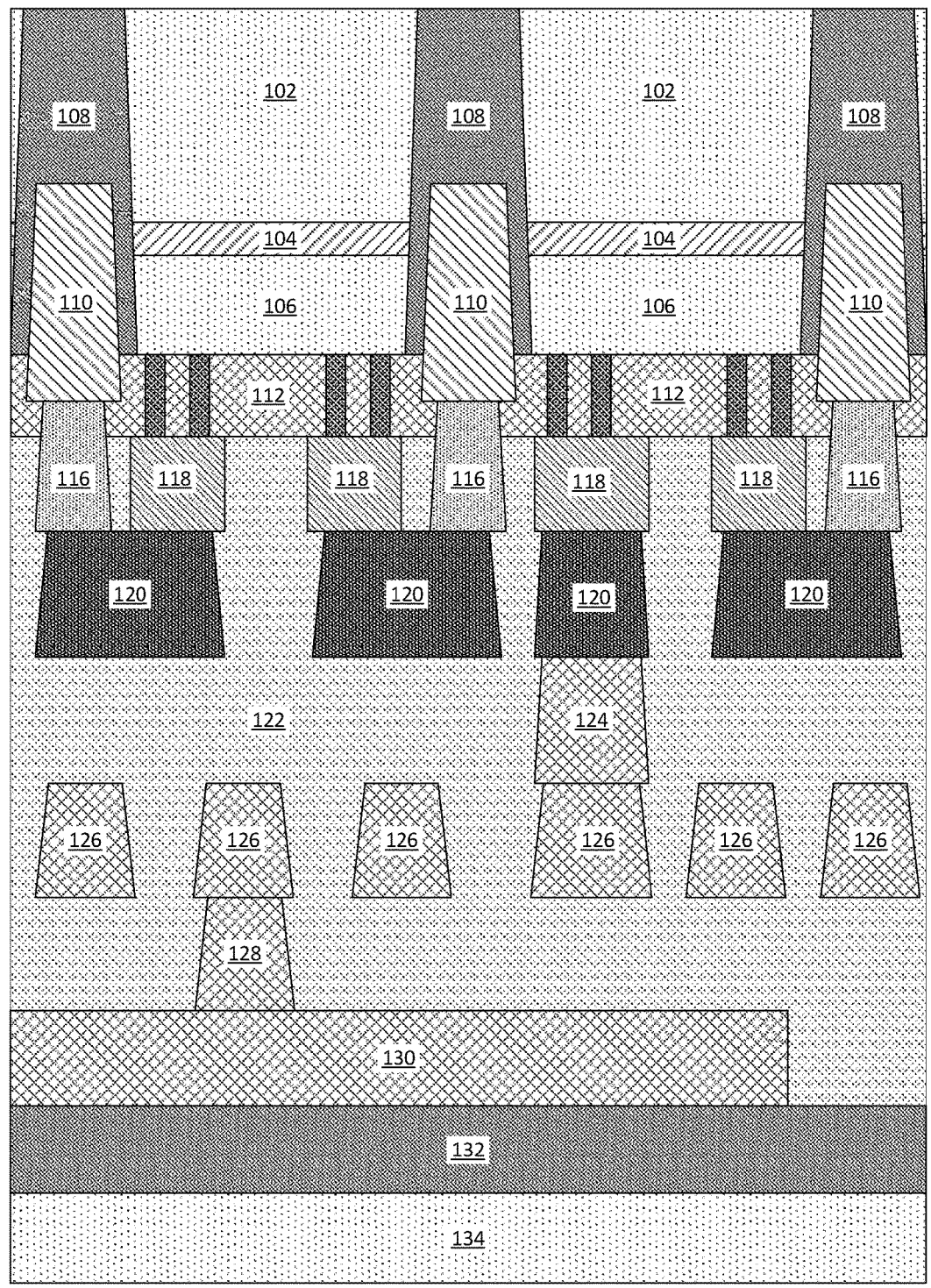
FIG. 7 is a cross-sectional view of the semiconductor device of FIG. 6 after additional fabrication operations, according to embodiments.

Referring now to FIG. 7, this figure depicts a cross-sectional view of the semiconductor device 100 of FIG. 6 after additional fabrication operations, according to embodiments. As shown in FIG. 7, substrate 102 thinning is performed (e.g., by a grinding operation, followed by CMP, followed by RIE, followed by another CMP/RIE cycles, etc) to remove a certain thickness of the substrate 102. As shown in FIG. 7, this material removal step is continued until the substrate 102 is thinned down to the level of the upper surface (as shown in FIG. 7) of the first dielectric layer 108. In other words, the first dielectric layer 108 may help to detect the endpoint for the substrate 102 thinning process. With the first dielectric layer 108 functioning as a thinning stop surface, the uniformity (or evenness) of the top surface (as shown in FIG. 7) of the semiconductor device 100 may be improved relative to certain related substrate thinning techniques that do not include a dielectric layer.

For the sake of understanding with regard to the effects of the first dielectric layer 108 in the present embodiments, a non-limiting example is provided. In this example, suppose that the substrate 102 has an initial thickness of 500 μm, and the grinding operation is intended to remove a majority of the thickness of this layer (e.g., removal of 480 μm of Si leaving only 20 μm remaining). There may be relatively large variations in the post-grind thickness of the remaining substrate 102. For example, some portions of the thinned substrate 102 may have a post-grind thickness of 20 μm, and other portions may have a post grind thickness of 18 μm or less. As such, given that the total remaining thickness of the substrate is small, these variations in the remainder of the substrate 102 can be relatively quite large. In the present embodiments, because the first dielectric layer 108 functions as a hard stop to the subsequent etching or CMP process, the variation in thickness of the remainder can be controlled to a much higher precision than in the related example. It should be appreciated that the μm dimensions given above are merely for the sake of explanation.

Figure 8:
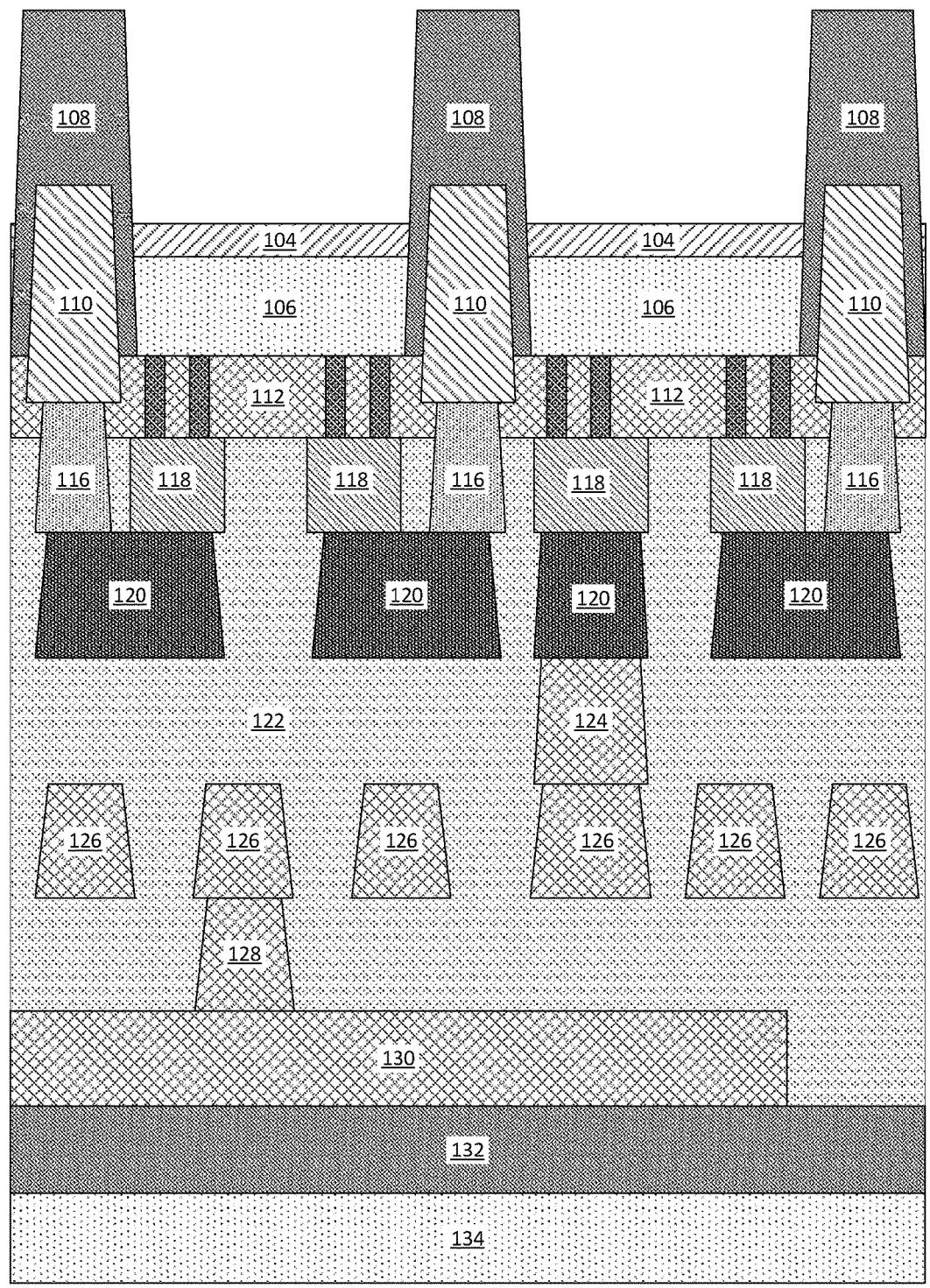
FIG. 8 is a cross-sectional view of the semiconductor device of FIG. 7 after additional fabrication operations, according to embodiments.

Referring now to FIG. 8, this figure depicts a cross-sectional view of the semiconductor device 100 of FIG. 7 after additional fabrication operations, according to embodiments. As shown in FIG. 8, a first etching process is performed to remove remaining portions of the Si substrate 102. This first etching process may be considerably slower than the rate of material removal during the previous coarse grinding process, and this is possible now because almost all of the material of the substrate 102 has already been removed through the use of the coarse grinding followed by CMP or RIE process. In certain examples, the first etching process may have a much higher selectivity for the Si in the substrate 102 relative to the SiGe in the SiGe layer 104. In other words, the first etching process will remove the Si faster than the SiGe.

Figure 9:
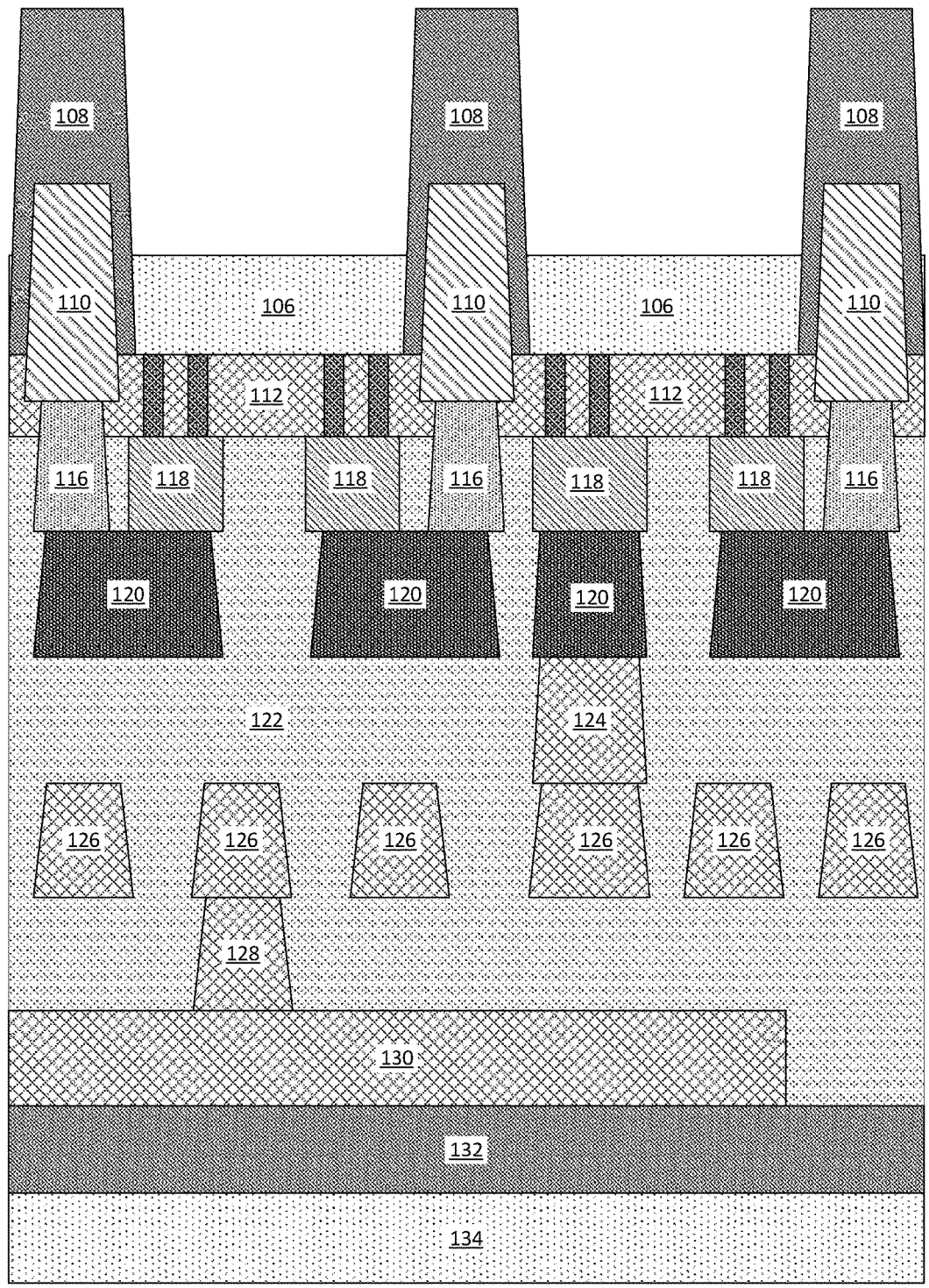
FIG. 9 is a cross-sectional view of the semiconductor device of FIG. 8 after additional fabrication operations, according to embodiments.

Referring now to FIG. 9, this figure depicts a cross-sectional view of the semiconductor device 100 of FIG. 8 after additional fabrication operations, according to embodiments. As shown in FIG. 9, the SiGe layer 104 may optionally be removed as well.

Figure 10:
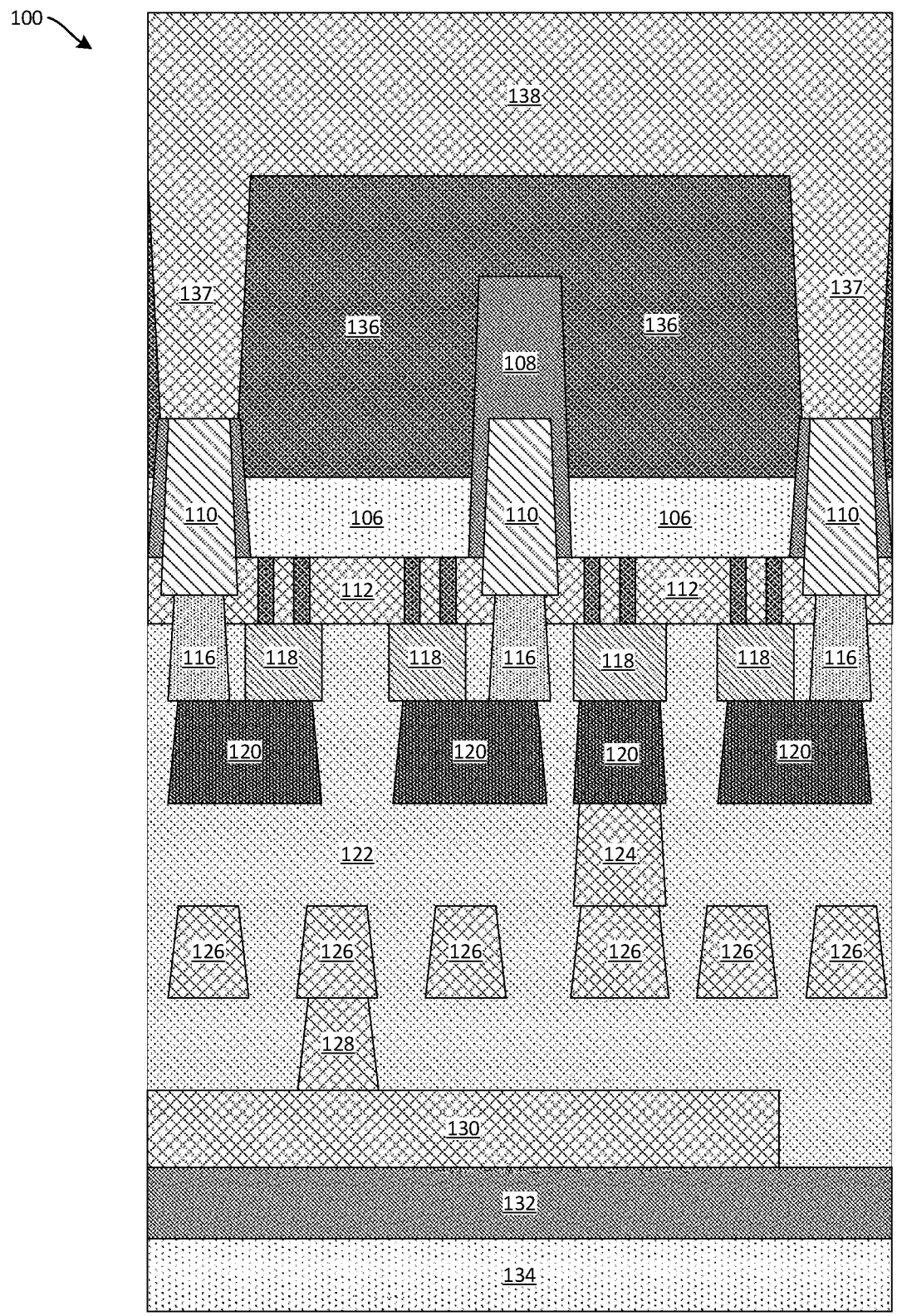
FIG. 10 is a cross-sectional view of the semiconductor device of FIG. 9 after additional fabrication operations, according to embodiments.

Referring now to FIG. 10, this figure depicts a cross-sectional view of the semiconductor device 100 of FIG. 9 after additional fabrication operations, according to embodiments. As shown in FIG. 10, an interlayer dielectric layer (ILD) 136 may be provided over the second substrate 106. Backside vias 137 may be etched into the ILD layer 136, and then a backside power wire 138 may be formed.

Figure 11:
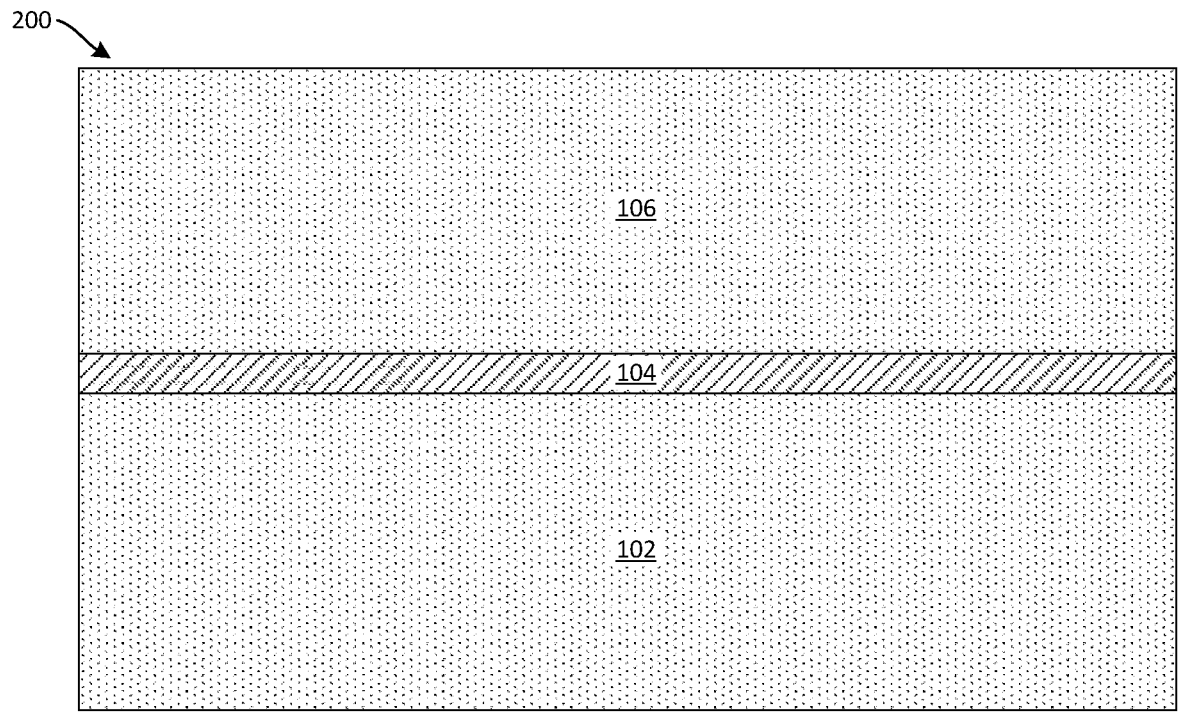
FIG. 11 is a cross-sectional view of a semiconductor device at an intermediate stage of the manufacturing process, according to embodiments.

Referring now to FIG. 11, this figure depicts a cross-sectional view of a semiconductor device 200 in an intermediate stage of the manufacturing process, according to embodiments. Certain aspects and components shown and described above with respect to the embodiments of FIGS. 1-10 (i.e., elements with same numbers) are the same as in the embodiments of FIGS. 11-21, and they may not always be repeated here for the sake of simplicity. As shown in FIG. 11, a substrate 102 is provided. The substrate 102 may be a bulk-semiconductor substrate. As will be described in further detail below, the substrate 102 will be ultimately subjected to a thinning process, where the substrate 102 is gradually removed by one or more of a grinding process and a chemical etching process. As shown in FIG. 11, a SiGe layer 104 is formed on the upper surface of the substrate 102. A second epitaxy layer 106 (e.g., additional Si material) is formed on the SiGe layer 104.

Figure 12:
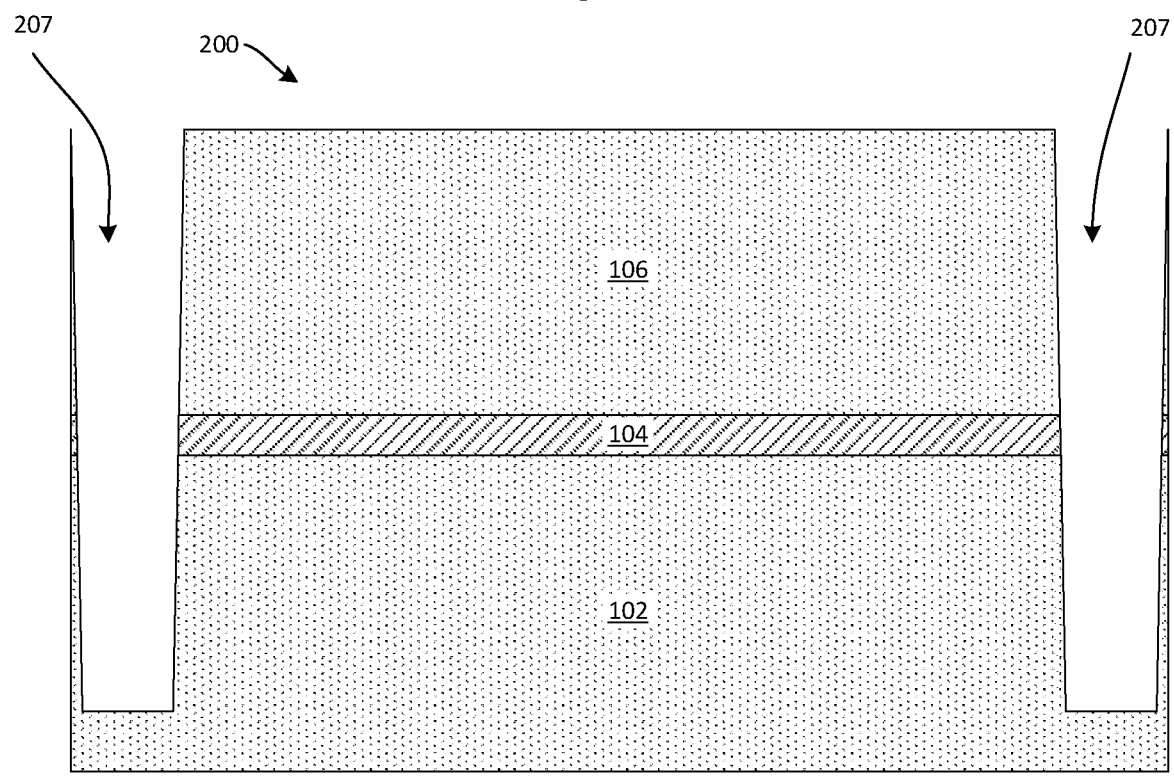
FIG. 12 is a cross-sectional view of the semiconductor device of FIG. 11 after additional fabrication operations, according to embodiments.

Referring now to FIG. 12, this figure depicts a cross-sectional view of the semiconductor device 200 of FIG. 11 after additional fabrication operations, according to embodiments. As shown in FIG. 12, trenches 207 (or vias) are patterned into the substrate 102 through the second substrate 106 and the SiGe layer 104. This patterning may be performed with any suitable etching technique such as RIE or plasma etching. As shown in FIG. 12, in certain examples, there may be a slight taper angle associated with the trenches 207. In this example, two trenches 207 are shown. However, it should be appreciated that any other suitable number or location of the trenches 207 may be utilized.

Figure 13:
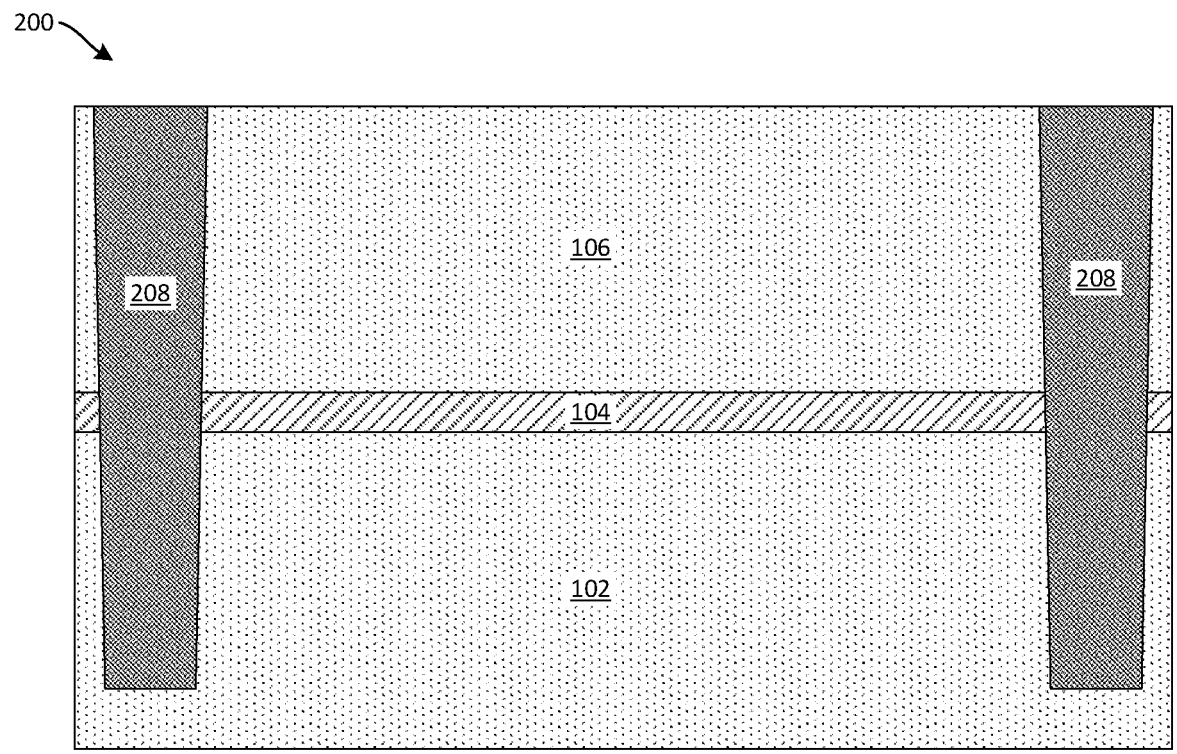
FIG. 13 is a cross-sectional view of the semiconductor device of FIG. 12 after additional fabrication operations, according to embodiments.

Referring now to FIG. 13, this figure depicts a cross-sectional view of the semiconductor device 200 of FIG. 12 after additional fabrication operations, according to embodiments. As shown in FIG. 13, after the formation of the trenches 207, they are filled in with a dielectric material to form a first dielectric layer 208. In certain examples, the first dielectric layer 208 may be formed in excess above the upper surface of the second substrate 106. Then, the semiconductor device 200 may be planarized with a suitable material removal process such as CMP.

Figure 14:
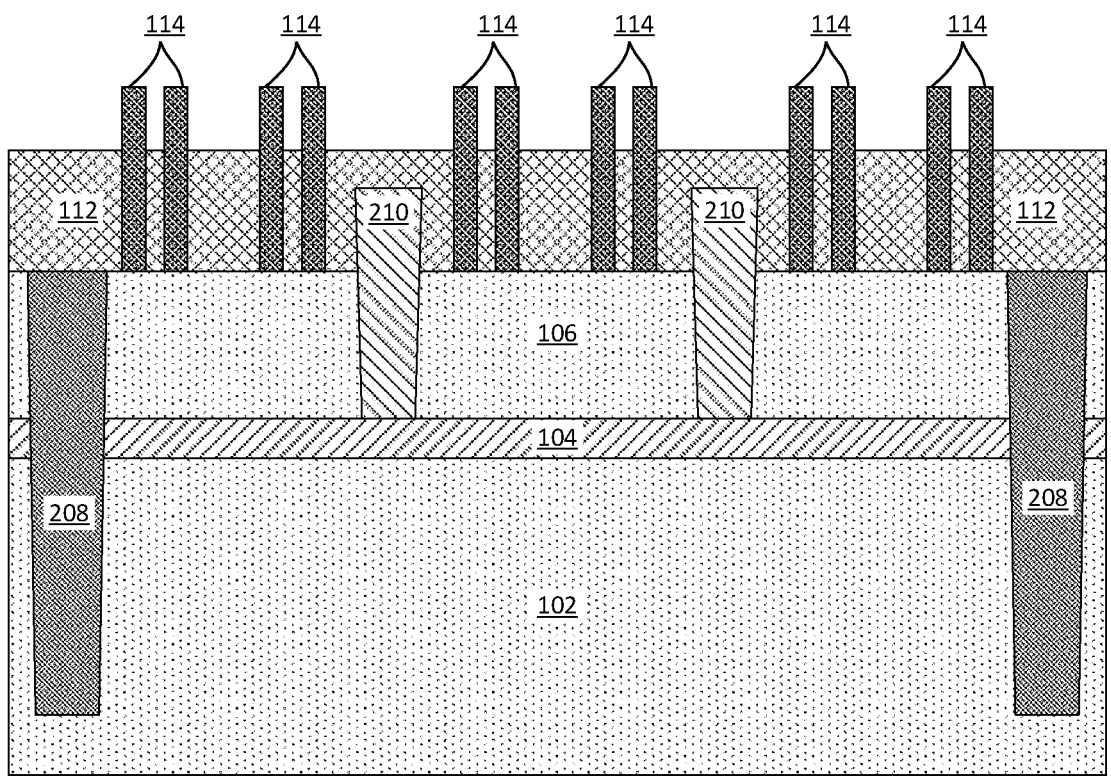
FIG. 14 is a cross-sectional view of the semiconductor device of FIG. 13 after additional fabrication operations, according to embodiments.

Referring now to FIG. 14, this figure depicts a cross-sectional view of the semiconductor device 200 of FIG. 13 after additional fabrication operations, according to embodiments. As shown in FIG. 14, after the formation of the first dielectric layer 208, additional fabrication operations are performed to define FEOL active regions, shallow trench isolation (STI) regions, and to form a buried power rail (BPR) layer 210. Regarding a "buried" power rail (or buried rail), the BPR layer 210 may be encased either within the shallow-trench isolation (STI) layer 112 or within the bulk silicon substrate 102 (and/or the second substrate 106) and the STI layer 112 together. In this example, the BPR layer 210 is not formed in the first dielectric layer 208, as was done in the embodiments described above with respect to FIG. 4.

Referring again to FIG. 14, in certain embodiments, the first dielectric layer 208 is formed to a sufficient depth below the bottom surface of the SiGe layer 104 so that when the wafer is later flipped upside down to perform wafer thinning, the first dielectric layer 108 functions as a hard stop to prevent excess material from being removed (e.g., removing or damaging portion of the SiGe layer 104). As shown in FIG. 14, the BPR layer 210 is formed in areas other than where the first dielectric layer 208 is formed. It should be appreciated that a combination of material removal processes (e.g., etching) and material addition processes (e.g., patterning and deposition) that are known one of skill in the art (and as described herein) may be used to generate the structures shown in FIG. 14. STI regions may be formed in various locations throughout the STI layer 112. It should be appreciated that the positions and locations of the various components (e.g., STI layer 112, transistor fins 114) may be varied in any suitable manner according to the specific application. However, in the embodiments described with respect to FIG. 14, the first dielectric layer 208 should be formed to a depth that is below the lower surface (as shown in FIG. 4) of the SiGe layer 104. In this regard, when the wafer is later flipped over for substrate 102 thinning, the first dielectric layer 208 may function as a hard stop to the thinning process to prevent (or minimize) any damage to the SiGe layer 104.

Figure 15:
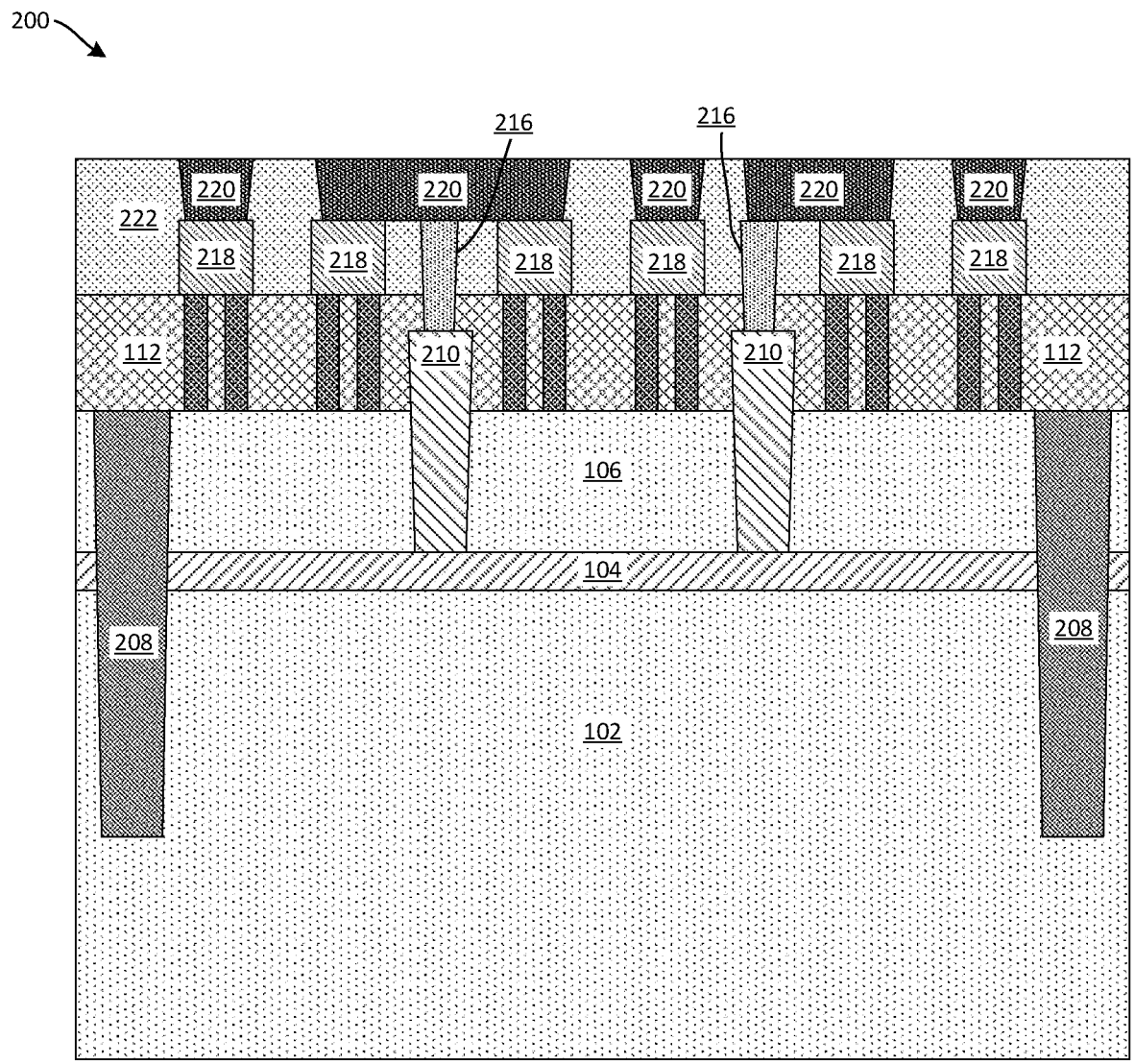
FIG. 15 is a cross-sectional view of the semiconductor device of FIG. 14 after additional fabrication operations, according to embodiments.

Referring now to FIG. 15, this figure depicts a cross-sectional view of the semiconductor device 200 of FIG. 14 after additional fabrication operations, according to embodiments. As shown in FIG. 15, several additional components are formed, which may include front-end-of-line (FEOL) components, middle-of-line (MOL) components, and back-end-of-line (BEOL) components. In the example shown in FIG. 15, source/drain epitaxial regions 218 are formed on top of the transistor fins 114. Several contact vias 216 electrically connect the BPR layer 210 to the source/drain epitaxial regions 218 through a contact 220.

Figure 16:
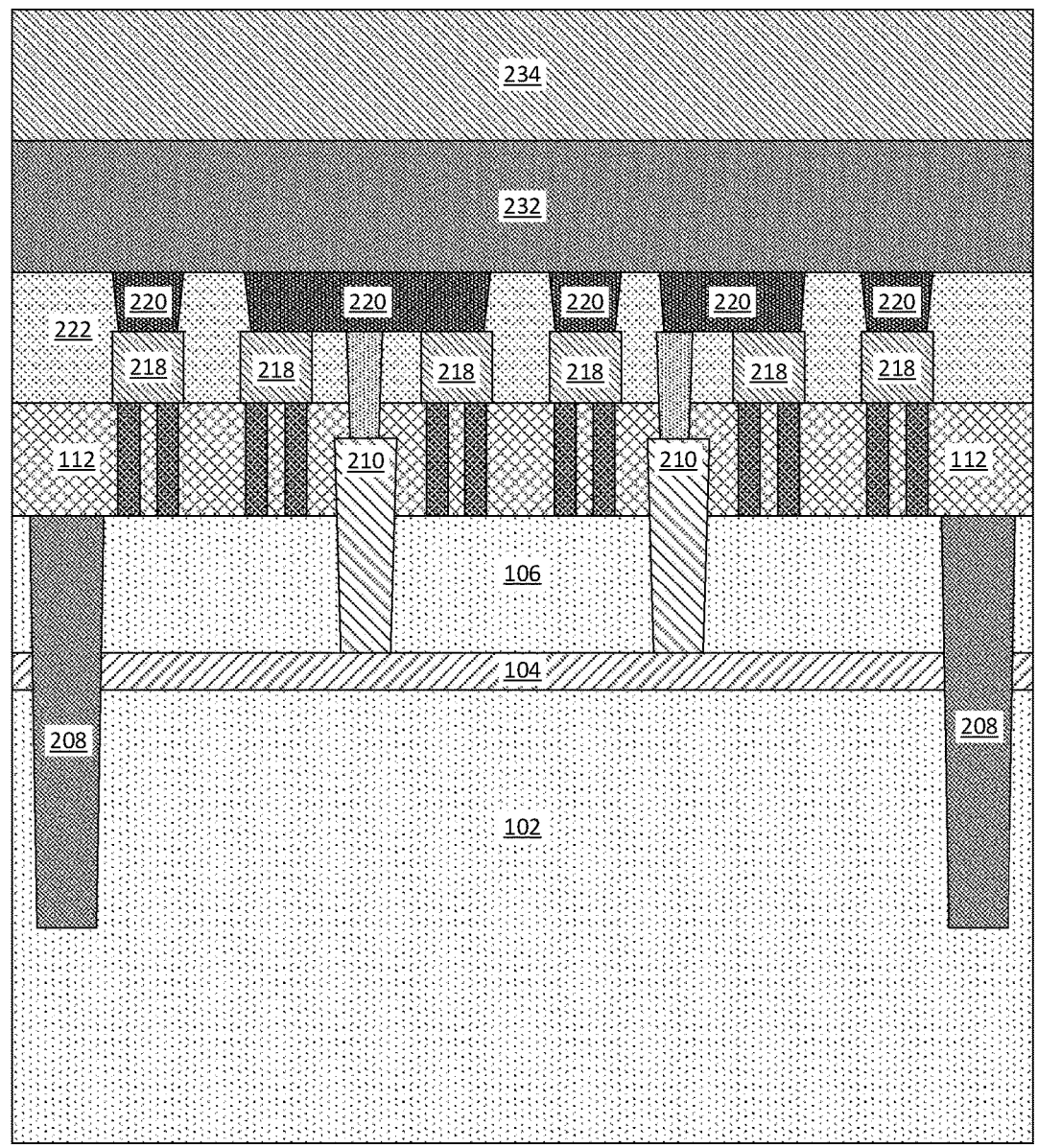
FIG. 16 is a cross-sectional view of the semiconductor device of FIG. 15 after additional fabrication operations, according to embodiments.

As shown in FIG. 16, BEOL layer 232 generically represents any suitable number or configuration of BEOL layers/components. It should be appreciated that the configuration of the FEOL, MOL and BEOL layers (and components thereof) depicted in FIG. 16 is merely one example that is used for the sake of providing context to the locations of the first dielectric layer 208 and the BPR layer 210 relative to the other components, and any suitable number/position/configuration of the these layers may be used. In other words, the different metal layers, contacts, vias etc., are merely provided to show a nonlimiting example of where the first dielectric layer 208, the BPR layer 210, and the SiGe layer 104 may be positioned relative to same.

Figure 17:
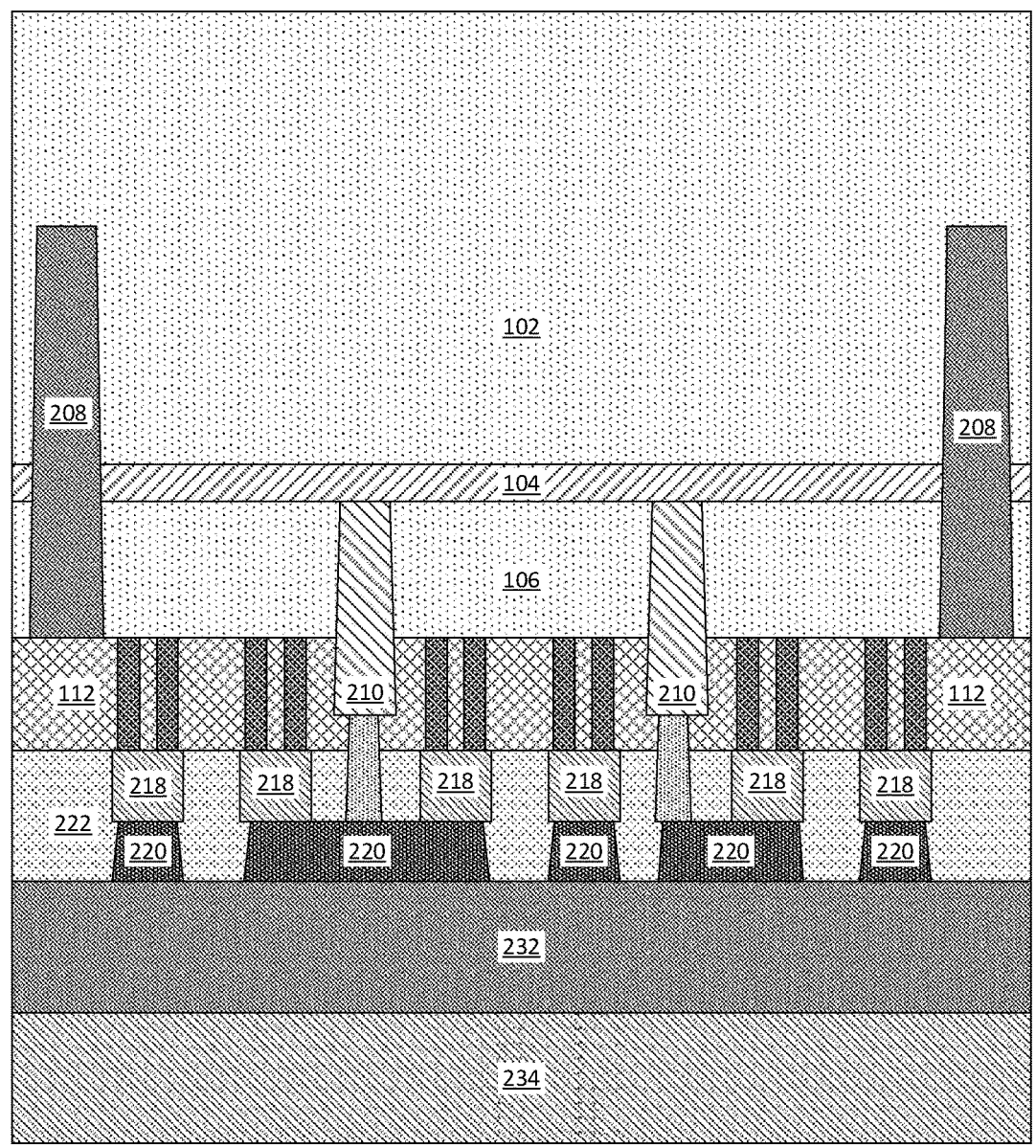
FIG. 17 is a cross-sectional view of the semiconductor device of FIG. 16 after additional fabrication operations, according to embodiments.

Referring now to FIG. 17, this figure depicts a cross-sectional view of the semiconductor device 200 of FIG. 16 after additional fabrication operations, according to embodiments. As shown in FIG. 17, the semiconductor device 200 is flipped upside down to prepare the device for substrate 102 thinning. In certain embodiments, a carrier wafer 234 is also bonded to the BEOL layers 232.

Figure 18:
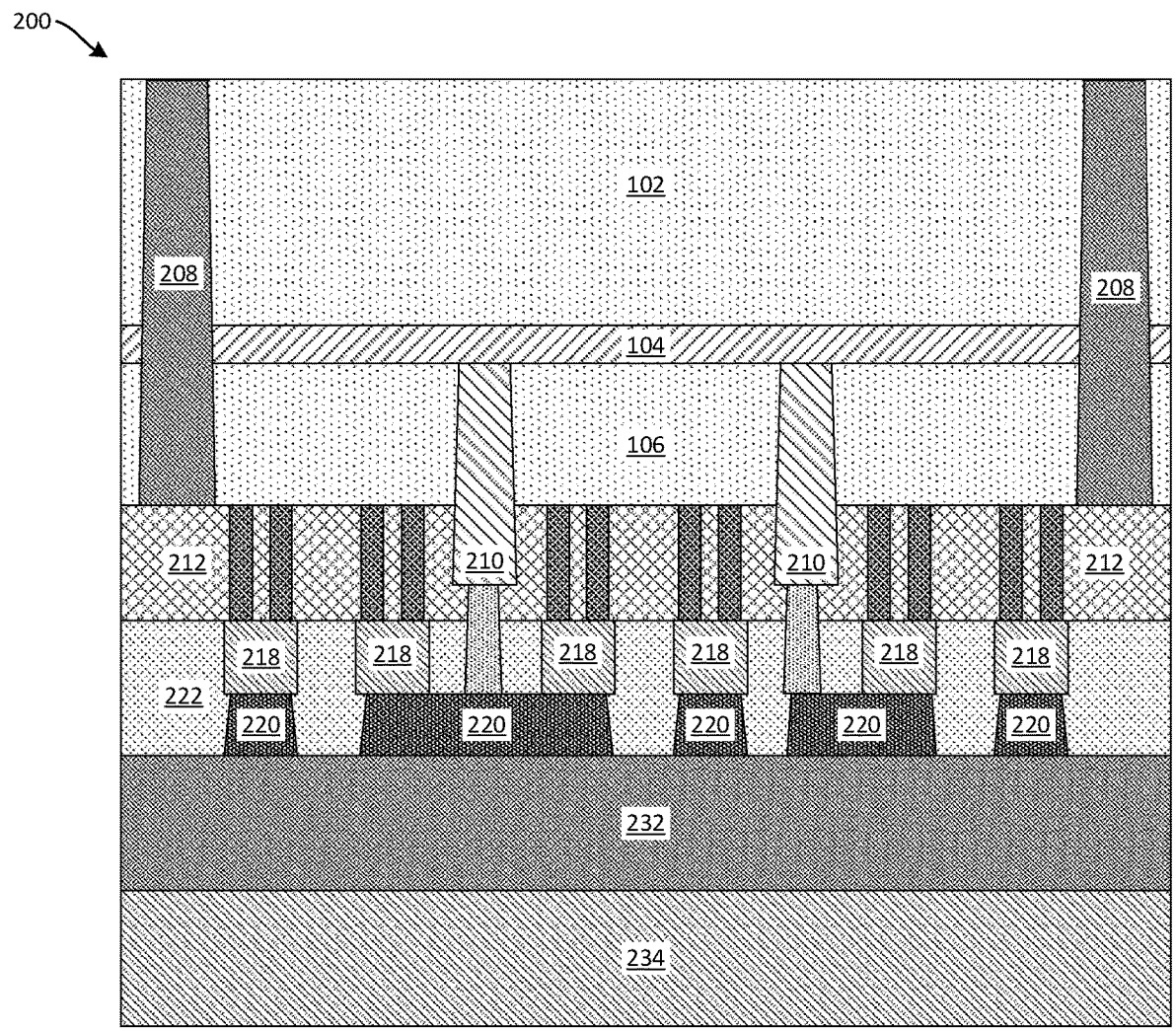
FIG. 18 is a cross-sectional view of the semiconductor device of FIG. 17 after additional fabrication operations, according to embodiments.

Referring now to FIG. 18, this figure depicts a cross-sectional view of the semiconductor device 200 of FIG. 17 after additional fabrication operations, according to embodiments. As shown in FIG. 18, substrate 102 thinning is performed (e.g., by a grinding operation+CMP+RIE, etc) to remove a certain thickness of the substrate 102. As shown in FIG. 18, this material removal step is continued until the substrate 102 is thinned down to the level of the upper surface (as shown in FIG. 18) of the first dielectric layer 208. In other words, the first dielectric layer 208 may help to detect the endpoint for the substrate 102 thinning process. With the first dielectric layer 208 functioning as a thinning stop surface, the uniformity (or evenness) of the top surface (as shown in FIG. 18) of the semiconductor device 200 may be improved relative to certain related substrate thinning techniques that do not include a dielectric layer. In the present embodiments, because the first dielectric layer 208 functions as a hard stop to the thinning process, the variation in thickness of the remainder can be controlled to a much higher precision than in related examples.

Figure 19:
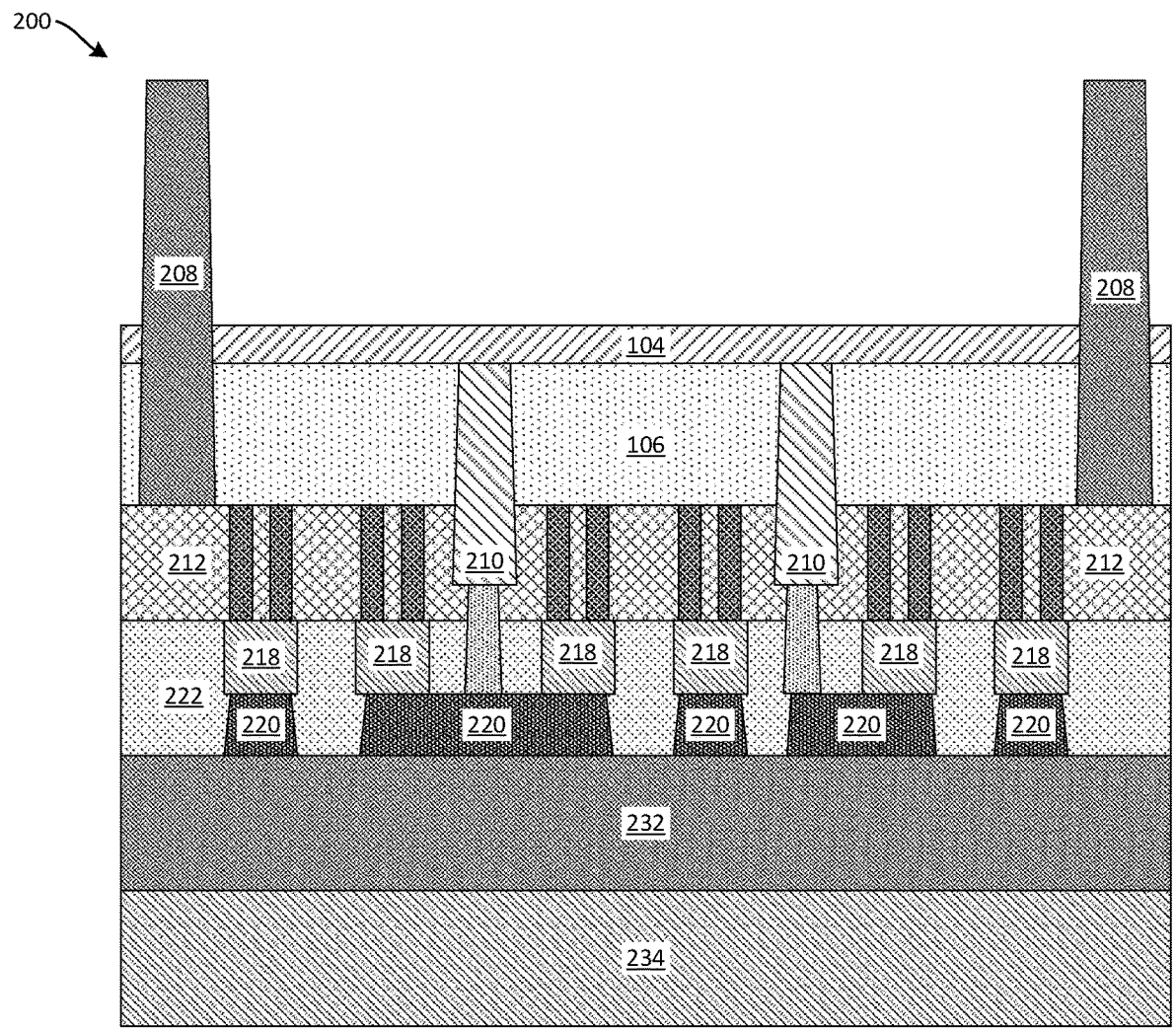
FIG. 19 is a cross-sectional view of the semiconductor device of FIG. 18 after additional fabrication operations, according to embodiments.

Referring now to FIG. 19, this figure depicts a cross-sectional view of the semiconductor device 200 of FIG. 18 after additional fabrication operations, according to embodiments. As shown in FIG. 19, a first etching process is performed to remove remaining portions of the Si substrate 102. This first etching process may be considerably slower than the rate of material removal during the previous coarse grinding process, and this is possible now because almost all of the material of the substrate 102 has already been removed through the use of the coarse grinding+CMP+RIE process. In certain examples, the first etching process may have a much higher selectivity for the Si in the substrate 102 relative to the SiGe in the SiGe layer 104. In other words, the first etching process will remove the Si faster than the SiGe.

Figure 20:
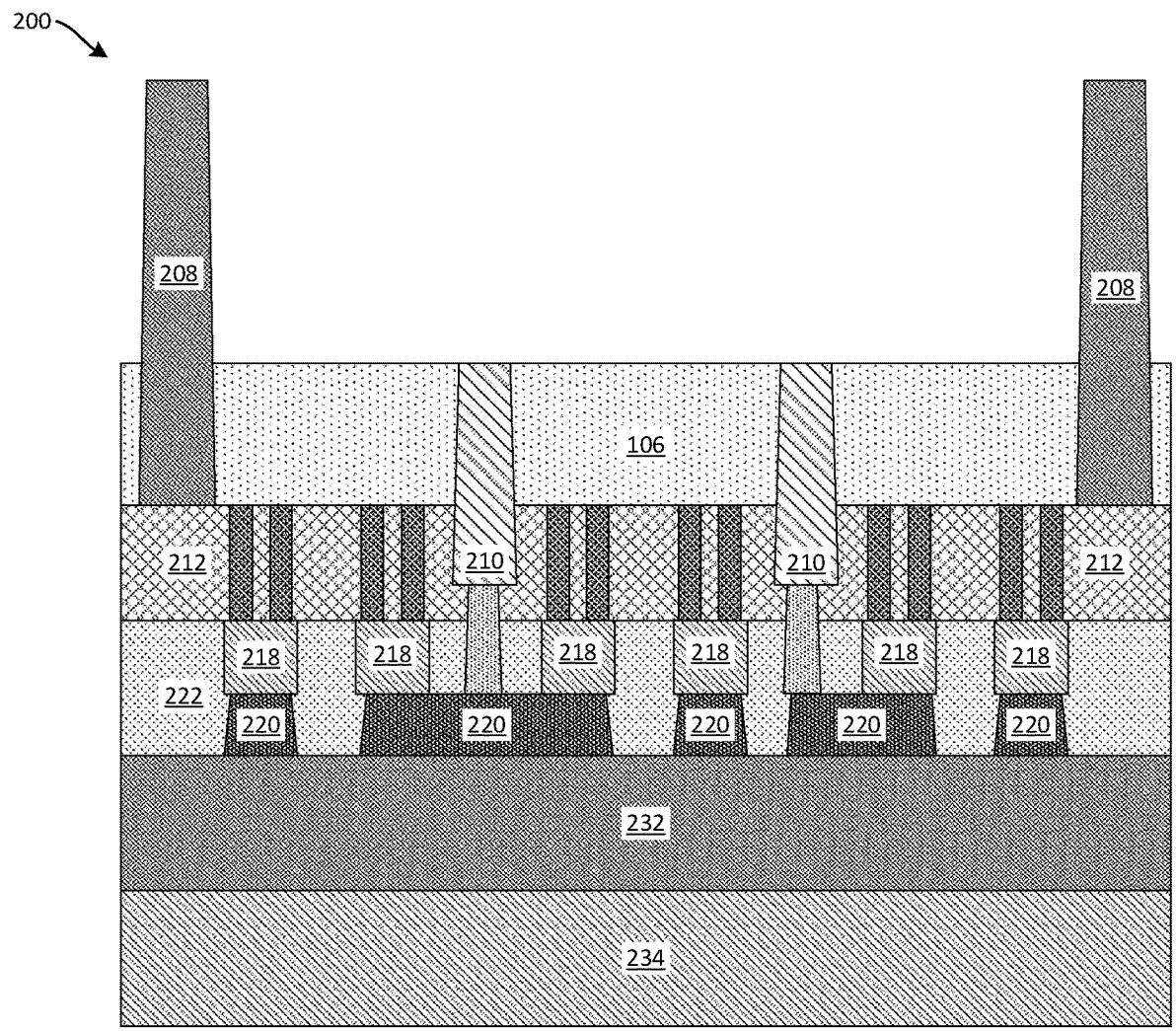
FIG. 20 is a cross-sectional view of the semiconductor device of FIG. 19 after additional fabrication operations, according to embodiments.

Referring now to FIG. 20, this figure depicts a cross-sectional view of the semiconductor device 200 of FIG. 19 after additional fabrication operations, according to embodiments. As shown in FIG. 20, the SiGe layer 104 may optionally be removed as well.

Figure 21:
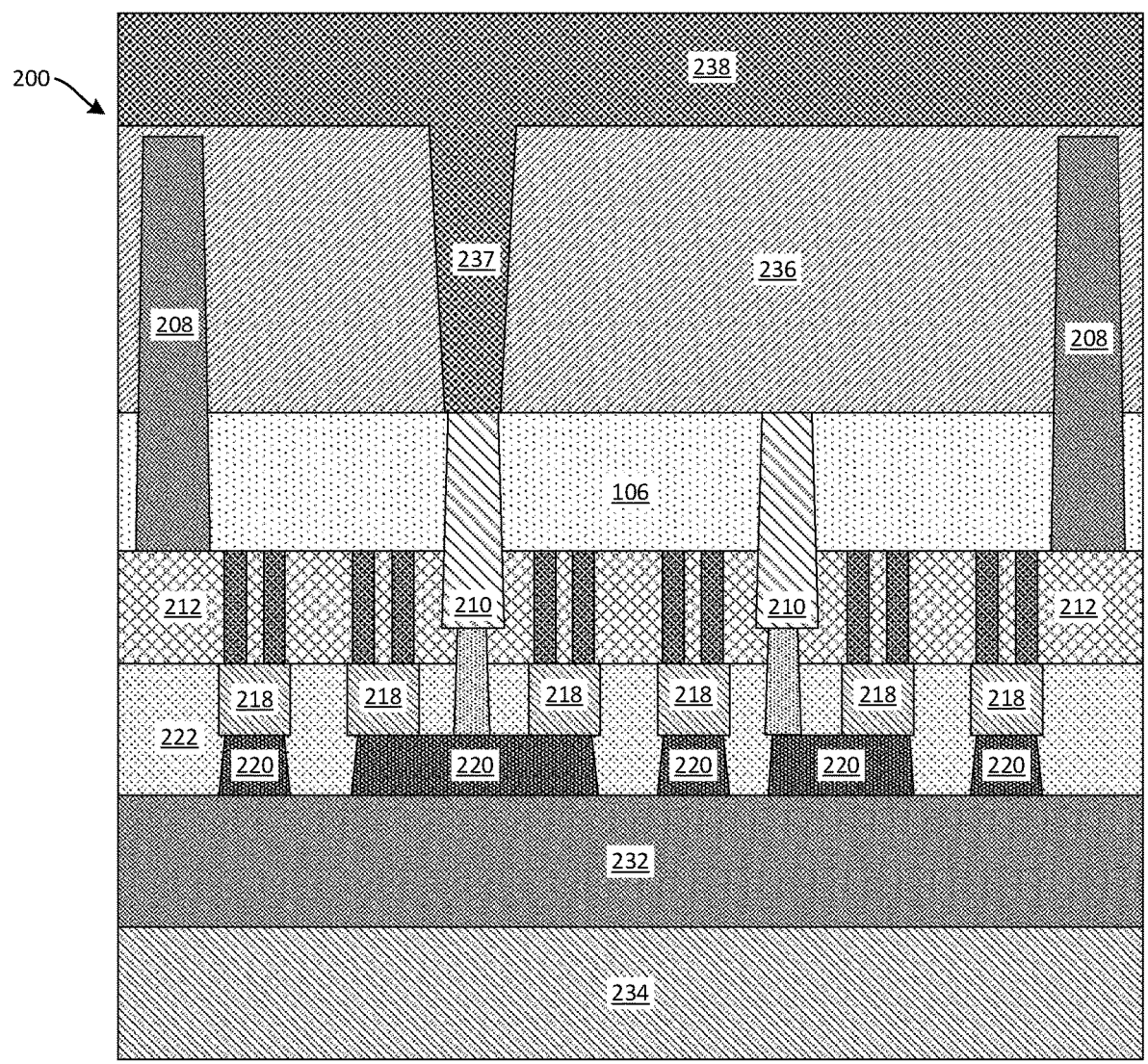
FIG. 21 is a cross-sectional view of the semiconductor device of FIG. 20 after additional fabrication operations, according to embodiments.

Referring now to FIG. 21, this figure depicts a cross-sectional view of the semiconductor device 200 of FIG. 20 after additional fabrication operations, according to embodiments. As shown in FIG. 21, an interlayer dielectric layer (ILD) 236 may be provided over the second substrate 106.

Backside vias 237 may be etched into the ILD layer 236, and then a backside power wire 238 may be formed.

Figure 22:
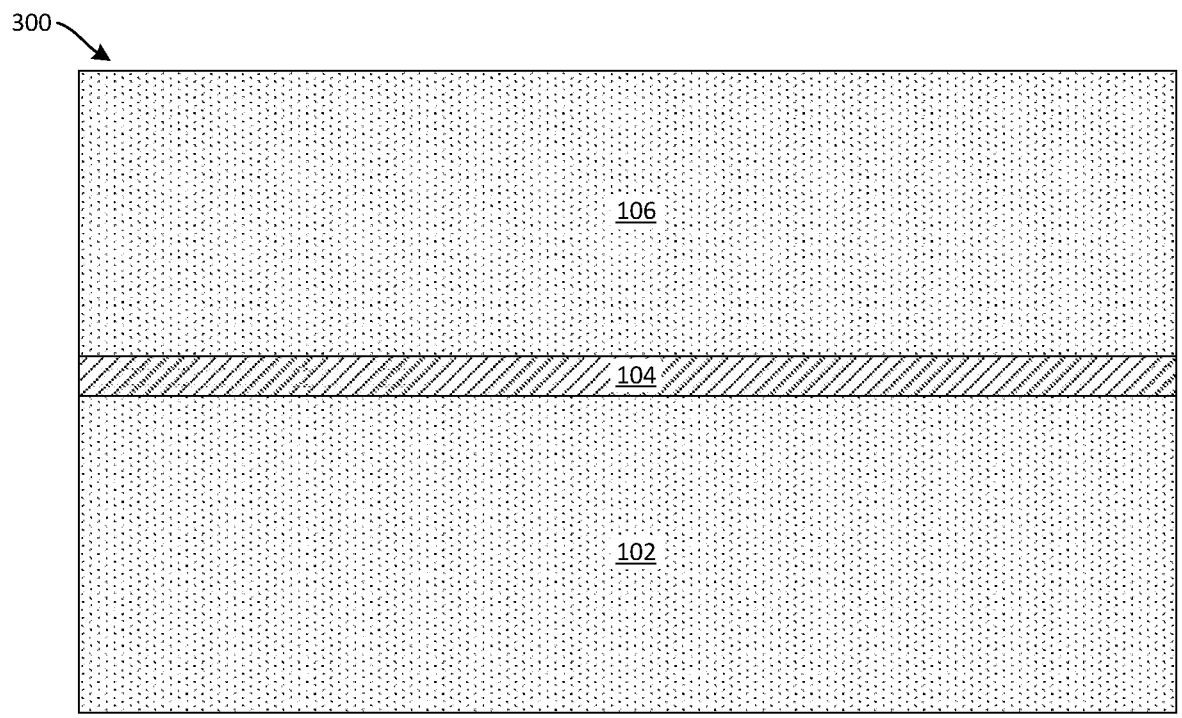
FIG. 22 is a cross-sectional view of a semiconductor device at an intermediate stage of the manufacturing process, according to embodiments.

Referring now to FIG. 22, this figure depicts a cross-sectional view of a semiconductor device 300, according to embodiments. As shown in FIG. 22, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) that those listed above. As will be described in further detail below, the substrate 102 will be ultimately subjected to a thinning process, where the substrate 102 is gradually removed by one or more of a grinding process and a chemical etching process. As shown in FIG. 22, a SiGe layer 104 is formed on the upper surface of the substrate 102. A second epitaxy 106 (e.g., additional Si material) is formed on the SiGe layer 104. In certain embodiments, an implant layer 303 (e.g., a boron implant) is provided at an intermediate position within the substrate 102. In these embodiments, when substrate 102 thinning is later performed, a presence of the boron in the implant layer 303 may be detected, which may indicate that a suitable amount of the thinning has been performed. Thus, in contrast to the earlier embodiments described herein where the first dielectric layer (e.g., first dielectric layer 108 or first dielectric layer 208) functions as a hard stop for the thinning process, the boron in the embodiment described with respect to FIG. 23 is a chemical that may be detected to determine when the thinning should be terminated.

Figure 23:
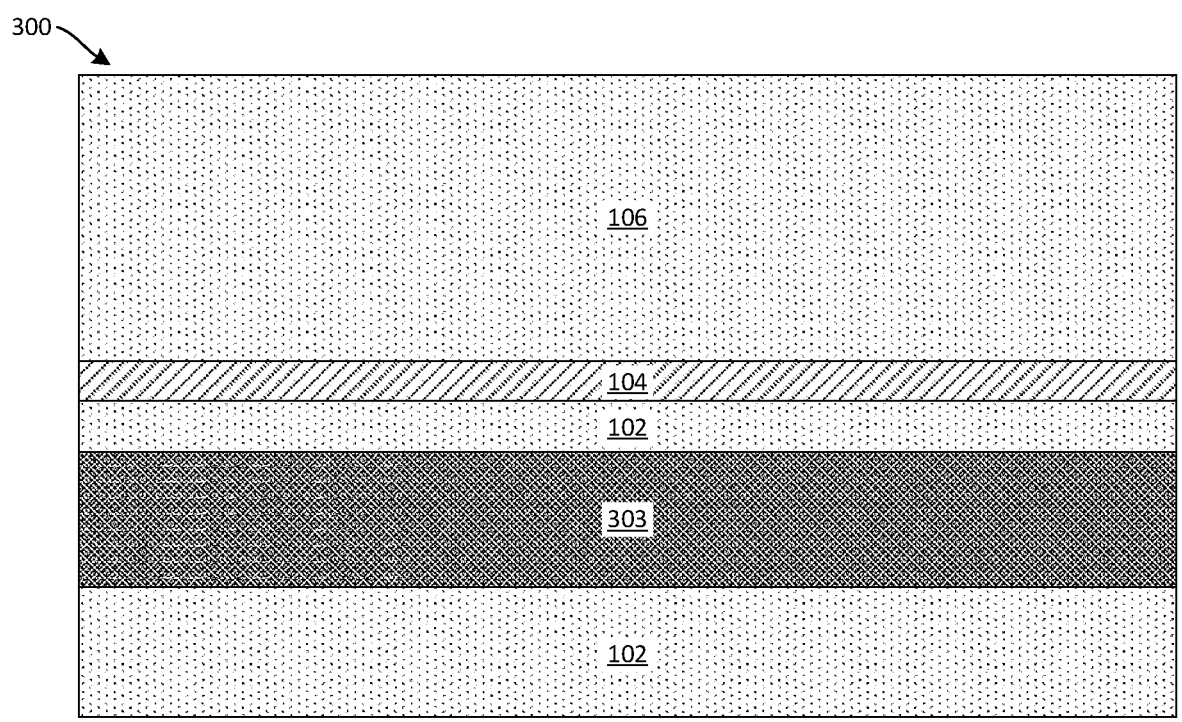
FIG. 23 is a cross-sectional view of the semiconductor device of FIG. 22 after additional fabrication operations, according to embodiments.
Figure 24:
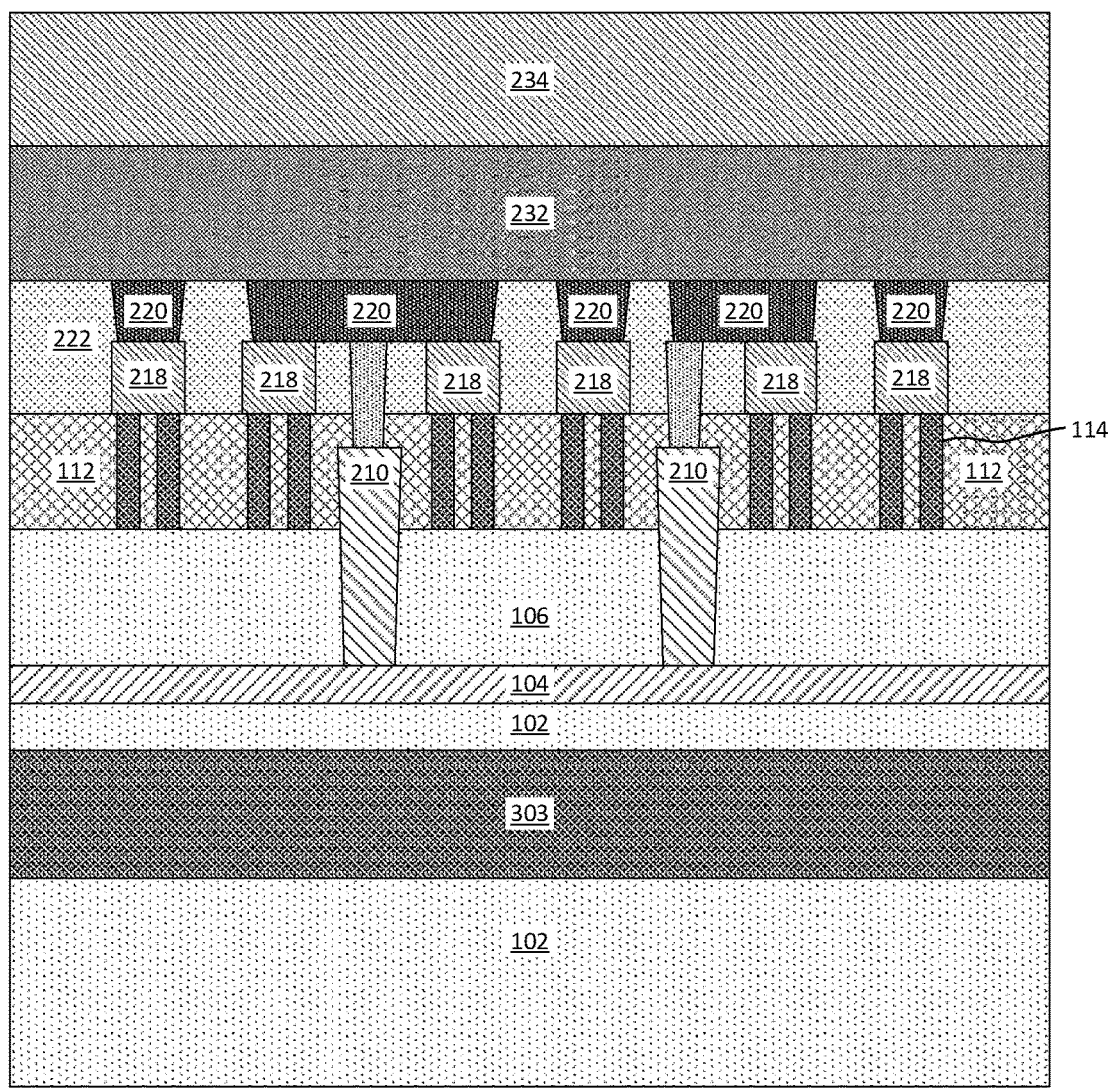
FIG. 24 is a cross-sectional view of the semiconductor device of FIG. 23 after additional fabrication operations, according to embodiments.

Referring now to FIG. 24, this figure depicts a cross-sectional view of the semiconductor device 300 of FIG. 23 after additional fabrication operations, according to embodiments. As shown in FIG. 24, additional fabrication operations are performed to define FEOL active regions, shallow trench isolation (STI) regions, and to form a buried power rail (BPR) layer 210. Regarding a "buried" power rail (or buried rail), the BPR layer 210 may be encased either within the shallow-trench isolation (STI) layer 112 or within the bulk silicon substrate 102 (and/or the second substrate 106) and the STI layer 112 together. In this example, there is no first dielectric layer 208 (e.g., as in the embodiments described above with respect to FIG. 4) because there is the implant layer 303 in the substrate 102 that will be later used to detect an end to the substrate 102 thinning process. STI regions may be formed in various locations throughout the STI layer 112. It should be appreciated that the positions and locations of the various components (e.g., STI layer 112, transistor fins 114) may be varied in any suitable manner according to the specific application. However, in the embodiments described with respect to FIG. 24, the first implant layer 303 should be formed to a depth that is below the lower surface (as shown in FIG. 4) of the SiGe layer 104. In this regard, when the wafer is later flipped over for substrate 102 thinning, boron in the implant layer 303 may be detected by one or more sensors to indicate a stopping point to the thinning/grinding process to prevent (or minimize) any damage to the SiGe layer 104.

Figure 25:
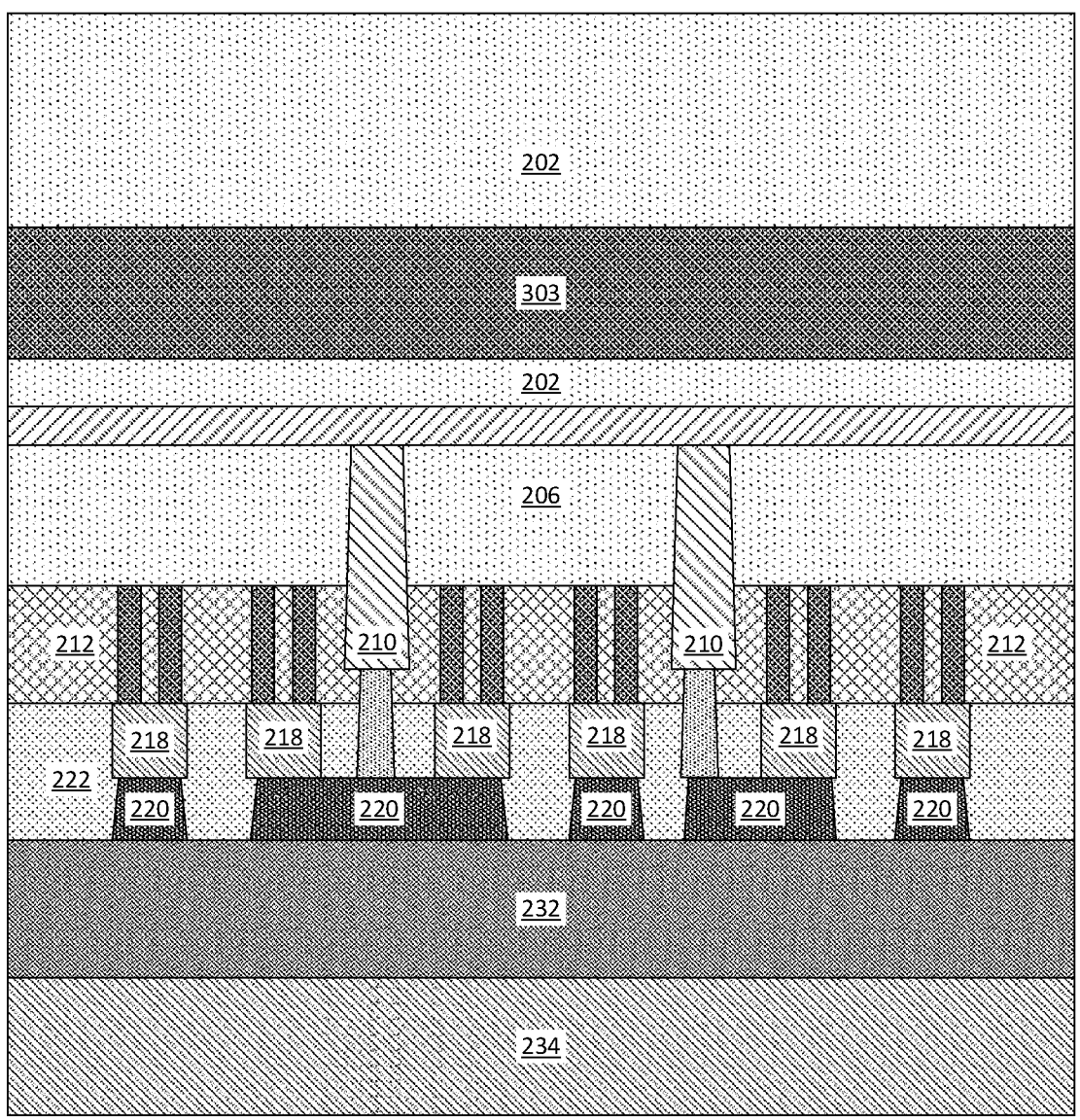
FIG. 25 is a cross-sectional view of the semiconductor device of FIG. 24 after additional fabrication operations, according to embodiments.

Referring now to FIG. 25, this figure depicts a cross-sectional view of the semiconductor device 300 of FIG. 24 after additional fabrication operations, according to embodiments. As shown in FIG. 25, the semiconductor device 300 is flipped upside down to prepare the device for substrate 102 thinning. In certain embodiments, a carrier wafer 234 is also bonded to the BEOL layers 232.

Figure 26:
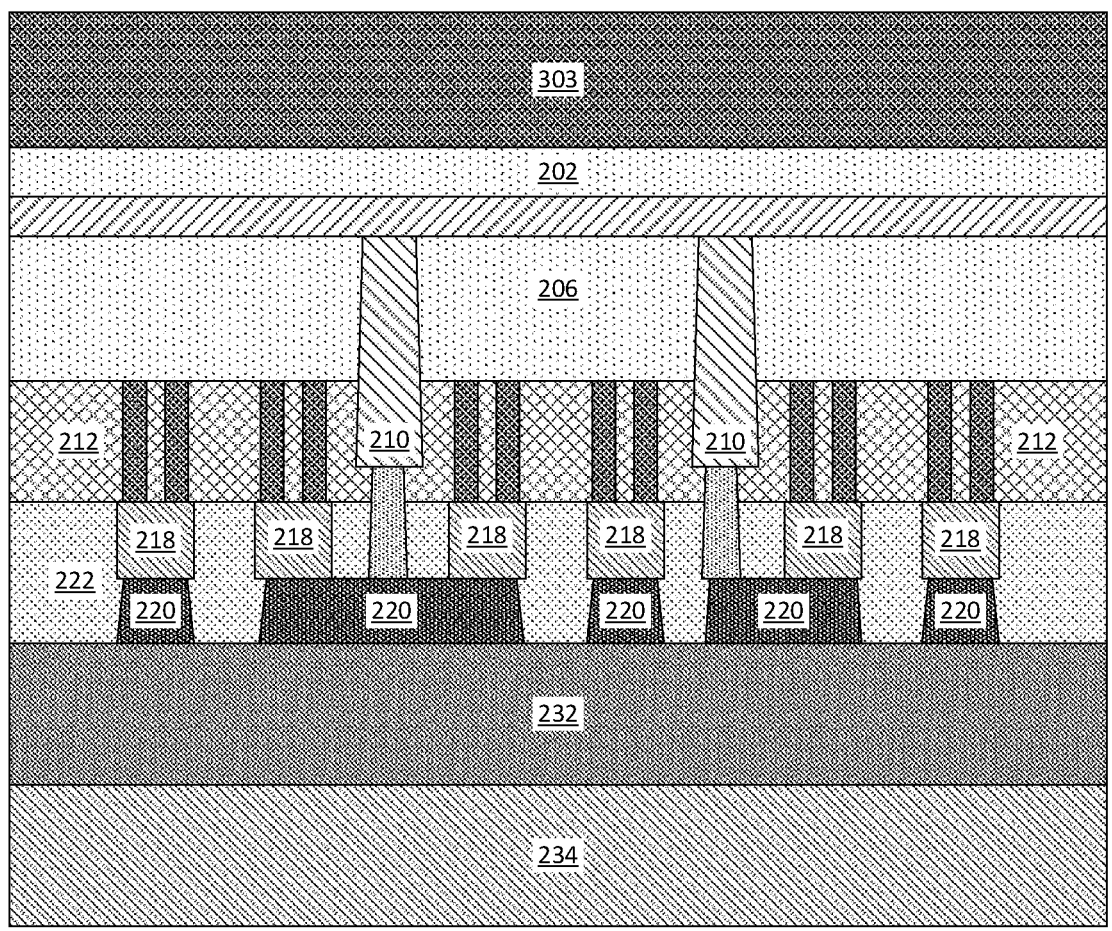
FIG. 26 is a cross-sectional view of the semiconductor device of FIG. 25 after additional fabrication operations, according to embodiments.

Referring now to FIG. 26, this figure depicts a cross-sectional view of the semiconductor device 300 of FIG. 25 after additional fabrication operations, according to embodiments. As shown in FIG. 26, substrate 102 thinning is performed (e.g., by a grinding operation+RIE) to remove a certain thickness of the substrate 102. As shown in FIG. 26, this material removal step is continued until the substrate 102 is thinned down the level of the mid of (as shown in FIG. 26) of the implant layer 303. In other words, the detection of boron in the implant layer 303 may help to detect the endpoint for the substrate 102 etching process. (e.g., a first grind may be used to remove, for example, about 480 μm Si, then a RIE process may be used with a slower Si removal rate compared to grinding, and then the etch is stopped when a lot of B signals are detected by a sensor during the etch process).

Figure 27:
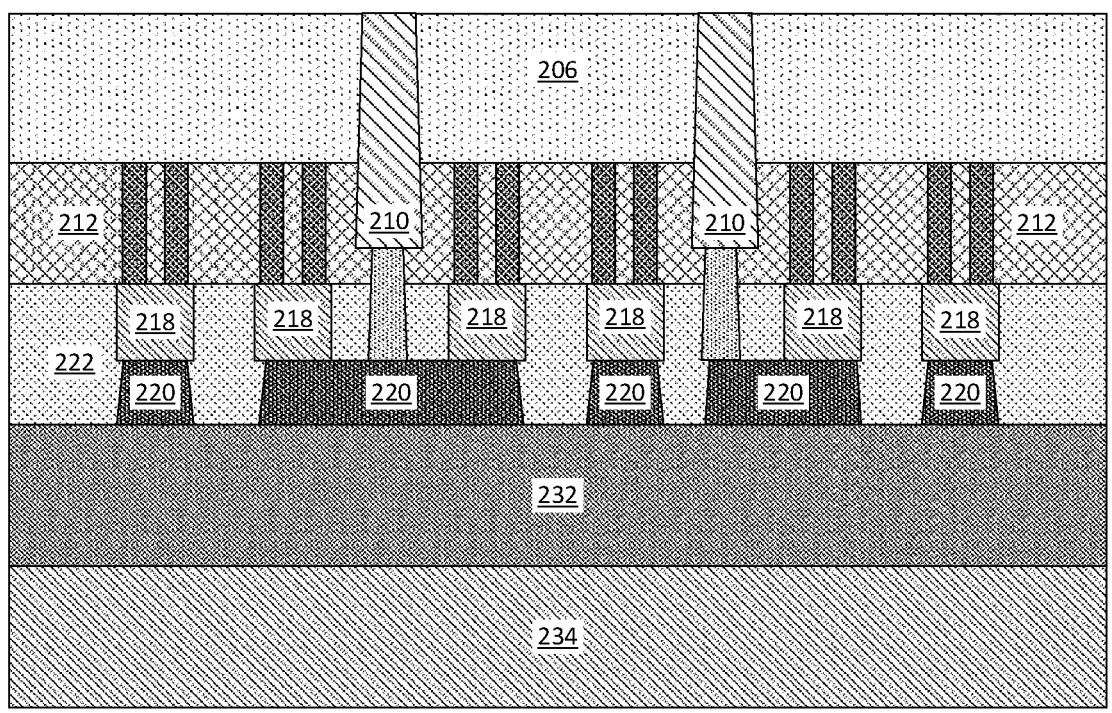
FIG. 27 is a cross-sectional view of the semiconductor device of FIG. 26 after additional fabrication operations, according to embodiments.

Referring now to FIG. 27, this figure depicts a cross-sectional view of the semiconductor device 300 of FIG. 26 after additional fabrication operations, according to embodiments. As shown in FIG. 27, a first etching process is performed to remove remaining portions of the implant layer 303 (in the silicon substrate 102) and the remaining portion of the Si substrate 102 that is below (as shown in FIG. 27) the implant layer 303. This etching process may be considerably slower than the rate of material removal during the previous coarse grinding process, and this is possible now because almost all of the material of the substrate 102 has already been removed through the use of the coarse grinding process. In certain examples, the first etching process may have a much higher selectivity for the Si in the substrate 102 relative to the SiGe in the SiGe layer 104. In other words, the first etching process will remove the Si faster than the SiGe. As shown in FIG. 27, the SiGe layer 104 may optionally be removed as well.

Figure 28:
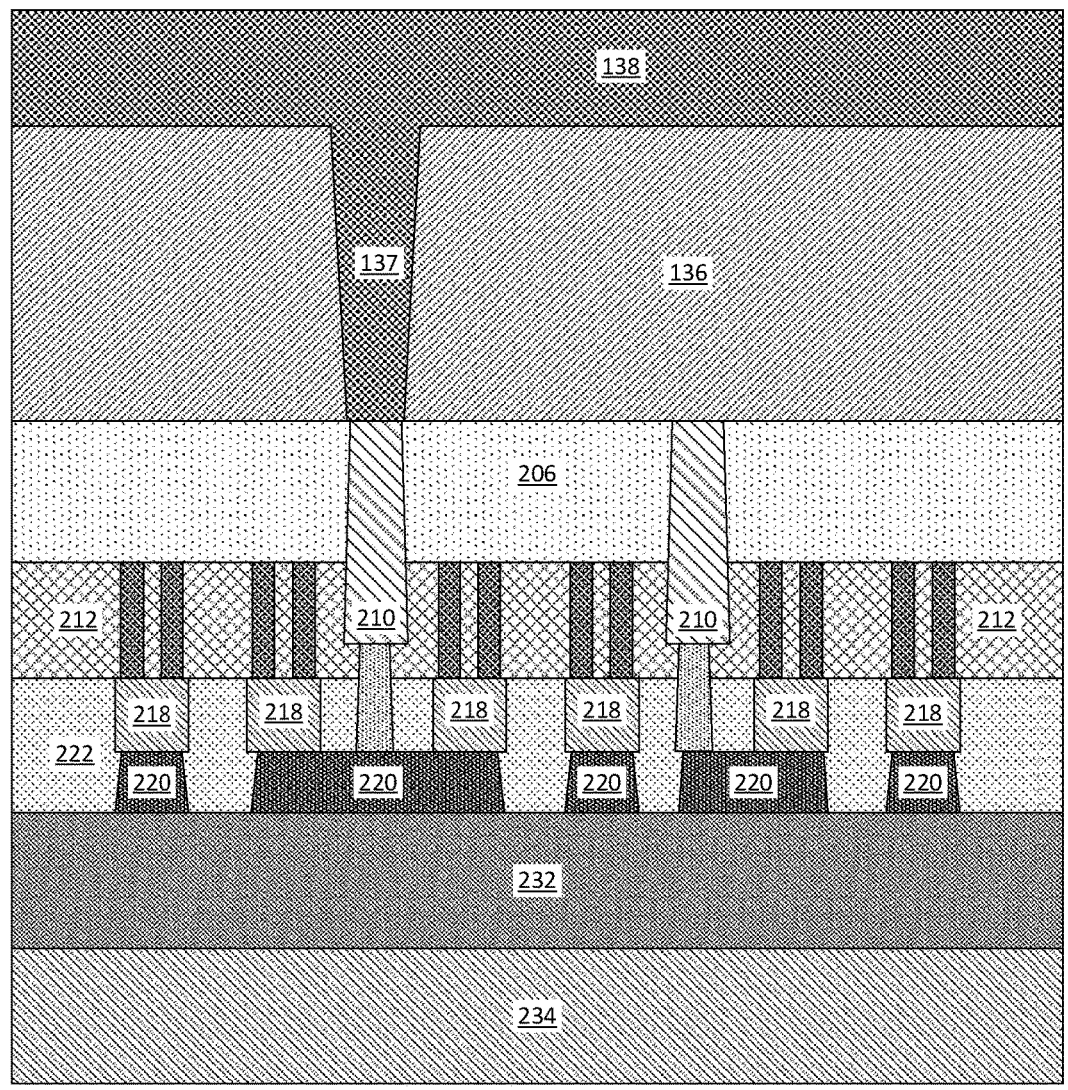
FIG. 28 is a cross-sectional view of the semiconductor device of FIG. 27 after additional fabrication operations, according to embodiments.

Referring now to FIG. 28, this figure depicts a cross-sectional view of the semiconductor device 300 of FIG. 27 after additional fabrication operations, according to embodiments. As shown in FIG. 28, an interlayer dielectric layer (ILD) 136 may be provided over the second substrate 106. Backside vias 137 may be etched into the ILD layer 136, and then a backside power wire 138 may be formed.

In the various embodiments described herein, either dielectric layers (which may function as a hard stop) or implant layers (which may allow for chemical detection of an element such as boron) may be incorporated into the substrate to allow for more precise and even thinning of the bulk of the semiconductor substrate. After such a course grinding is completed, the relatively small amounts of the remaining substrate (and optionally a SiGe layer) may be removed with a chemical etching process and may allow for a reduction (or elimination) of damage to other layers in the semiconductor device.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a semiconductor device, the method comprising:
   forming a sacrificial epitaxial layer on a substrate;
   forming a first recess through the sacrificial epitaxial layer and partially through the substrate from a first side of the substrate;
   forming a dielectric layer in the first recess;
   forming a second recess partially through the dielectric layer to a level that is below the sacrificial epitaxial layer from the first side of the substrate by partially removing material of the dielectric layer;
   forming a buried power rail (BPR) in the second recess of the dielectric layer;
   thinning the substrate from a second side of the substrate to a level of the dielectric layer, the second side of the substrate being opposite to the first side of the substrate.

2. The method according to claim 1, further comprising forming a buried oxide layer on the substrate, and forming a Si channel layer on the buried oxide layer.

3. The method according to claim 2, wherein the first recess extends through the Si channel layer, the buried oxide layer, and partially through the substrate.

4. The method according to claim 1, further comprising forming front-end-of-line (FEOL) structures, middle-of-line (MOL) and back-end-of-line (BEOL) structures on the substrate.

5. The method according to claim 1, wherein thinning the substrate includes backside grinding of the substrate.

6. The method according to claim 5, further comprising, after thinning the substrate, removing remaining portions of the substrate with an etching process.

7. The method according to claim 6, further comprising:
   providing a buried oxide layer on the substrate; and
   after removing the remaining portions of the substrate, removing the buried oxide layer with an etching process.

8. The method according to claim 6, further comprising forming an interlayer dielectric (ILD) layer over the BPR, and etching through the ILD layer and the dielectric layer to expose at least portions of the BPR.

9. The method according to claim 8, further comprising forming a backside power distribution network on the ILD layer, the backside power distribution network being electrically connected to the BPR.

10. The method according to claim 1, further comprising forming shallow trench isolation (STI) regions between portions of the BPR.

11. A method of manufacturing a semiconductor device, the method comprising:
    forming a sacrificial epitaxial layer on a substrate;
    forming a first recess through the sacrificial epitaxial layer and partially through the substrate from a first side of the substrate;
    forming a dielectric layer in the first recess;
    forming a buried power rail (BPR) on the sacrificial epitaxial layer to a depth that is less than a depth of the first recess; and
    thinning the substrate from a second side of the substrate, the thinning stopped at a level of the dielectric layer, the second side of the substrate being opposite to the first side of the substrate.

12. The method according to claim 11, further comprising forming a buried oxide layer on the substrate, and forming the BPR on the buried oxide layer in an area other than an area occupied by the first recess.

13. The method according to claim 12, further comprising forming a Si channel layer on the buried oxide layer.

14. The method according to claim 13, wherein the first recess extends through the Si channel layer, the buried oxide layer, and partially through the substrate.

15. The method according to claim 11, wherein the dielectric layer is a hard stop layer for the thinning of the substrate.

16. The method according to claim 11, wherein thinning the substrate includes backside grinding of the substrate.

17. The method according to claim 16, further comprising, after thinning the substrate, removing remaining portions of the substrate with an etching process.

* * * * *